(12) United States Patent
Horita et al.

(10) Patent No.: US 10,715,110 B2
(45) Date of Patent: Jul. 14, 2020

(54) ACOUSTIC WAVE FILTER DEVICE, MULTIPLEXER, RF FRONT-END CIRCUIT, AND COMMUNICATION APPARATUS

(71) Applicant: Murata Manufacturing Co., Ltd., Kyoto (JP)

(72) Inventors: Atsushi Horita, Kyoto (JP); Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/354,276

(22) Filed: Mar. 15, 2019

(65) Prior Publication Data

US 2019/0214970 A1    Jul. 11, 2019

Related U.S. Application Data

(63) Continuation of application No. PCT/JP2017/033237, filed on Sep. 14, 2017.

(30) Foreign Application Priority Data

Sep. 16, 2016 (JP) .................. 2016-182411

(51) Int. Cl.
*H03H 9/145* (2006.01)
*H03H 9/64* (2006.01)
(Continued)

(52) U.S. Cl.
CPC ...... *H03H 9/6483* (2013.01); *H03H 9/14544* (2013.01); *H03H 9/25* (2013.01);
(Continued)

(58) Field of Classification Search
CPC ........................ H03H 9/6483; H03H 9/4544
See application file for complete search history.

(56) References Cited

U.S. PATENT DOCUMENTS 6,472,953 B1 * 10/2002 Sakuragawa ........ H03H 9/6483
333/133
2009/0201104 A1 8/2009 Ueda et al.
(Continued)

FOREIGN PATENT DOCUMENTS

JP 2000-323961 A 11/2000
JP 2009-207116 A 9/2009
(Continued)

OTHER PUBLICATIONS

International Search Report for International Application No. PCT/JP2017/033237, dated Dec. 5, 2017.
(Continued)

*Primary Examiner* — Tuan H Nguyen
(74) *Attorney, Agent, or Firm* — Pearne & Gordon LLP

(57) ABSTRACT

An acoustic wave filter device includes a first resonant circuit, a second resonant circuit, a first interconnect line, and a second interconnect line. The second resonant circuit includes a second parallel-arm resonator, and a frequency-tuning circuit that allows tuning of the resonant frequency of the second parallel-arm resonator. The frequency-tuning circuit includes a capacitor, and a switching element connected in parallel with the capacitor. The first interconnect line is an interconnect line connected to the portion of the series-arm resonator located adjacent to the first input/output terminal. The second interconnect line is an interconnect line connecting the parallel-arm resonator with the switching element, or an interconnect line connecting the parallel-arm resonator with the capacitor. A first transmission line formed by the first interconnect line, and a second transmission line formed by the second interconnect line are magnetically coupled with each other.

18 Claims, 21 Drawing Sheets

(51) Int. Cl.
*H04B 1/18* (2006.01)
*H03H 9/72* (2006.01)
*H04B 1/00* (2006.01)
*H03H 9/25* (2006.01)
*H04B 1/04* (2006.01)
*H03H 9/54* (2006.01)
*H03H 9/60* (2006.01)
*H03H 7/01* (2006.01)
*H03H 7/09* (2006.01)

(52) U.S. Cl.
CPC ............ *H03H 9/542* (2013.01); *H03H 9/605* (2013.01); *H03H 9/6403* (2013.01); *H03H 9/6436* (2013.01); *H03H 9/72* (2013.01); *H04B 1/0057* (2013.01); *H04B 1/0458* (2013.01); *H04B 1/18* (2013.01); *H03H 7/0123* (2013.01); *H03H 7/09* (2013.01)

(56) References Cited

U.S. PATENT DOCUMENTS

| | | |
|---|---|---|
| 2009/0251235 A1 | 10/2009 | Belot et al. |
| 2015/0042417 A1* | 2/2015 | Onodera .............. H03H 9/6433 333/195 |
| 2016/0028365 A1 | 1/2016 | Takeuchi |
| 2017/0077896 A1 | 3/2017 | Sugaya et al. |

FOREIGN PATENT DOCUMENTS

| | | |
|---|---|---|
| JP | 2015-033080 A | 2/2015 |
| WO | 2014/168161 A1 | 10/2014 |
| WO | 2016/136413 A1 | 9/2016 |

OTHER PUBLICATIONS

Written Opinion for International Application No. PCT/JP2017/033237, dated Dec. 5, 2017.

* cited by examiner

ACOUSTIC WAVE FILTER DEVICE, MULTIPLEXER, RF FRONT-END CIRCUIT, AND COMMUNICATION APPARATUS

This is a continuation of International Application No. PCT/JP2017/033237 filed on Sep. 14, 2017 which claims priority from Japanese Patent Application No. 2016-182411 filed on Sep. 16, 2016. The contents of these applications are incorporated herein by reference in their entireties.

BACKGROUND

Technical Field

The present disclosure relates to an acoustic wave filter device, a multiplexer, a radio frequency (RF) front-end circuit, and a communication apparatus.

In related art, acoustic wave filter devices employing an acoustic wave resonator for components such as a bandpass filter placed at the front-end section of mobile communication apparatuses are in widespread use. To meet the demand for increasingly complex operations such as multimode/multiband operations, RF front-end circuits including a plurality of acoustic wave filter devices have been put into practical use.

As an example of acoustic wave filter devices designed for multiband operations, acoustic wave filter devices configured as described below are known. In these acoustic wave filter devices, in the parallel-arm resonant circuit of a ladder filter including a bulk acoustic wave (BAW) resonator, a capacitor and a switching element that are connected in parallel with each other are connected in series with a parallel-arm resonator (see, for example, Patent Document 1). Such an acoustic wave filter device constitutes a tunable filter (i.e., a frequency-tunable filter with tunable frequency) in which the attenuation pole on the lower side of the pass band is shifted in frequency in response to switching of a switching element between conduction (ON) and non-conduction (OFF).

Patent Document 1: U.S. Patent Application Publication No. 2009/0251235

BRIEF SUMMARY

For a typical filter, the pass band of the filter is defined by the anti-resonant frequency of a parallel-arm resonant circuit, and the attenuation pole on the lower side of the pass band is defined by the resonant frequency of the parallel-arm resonant circuit. The stop band is defined by this attenuation pole.

With the configuration of the conventional acoustic wave filter device mentioned above, the attenuation on the lower side of the pass band deteriorates when the attenuation pole on the lower side of the pass band is shifted higher in frequency by switching the switching element between conduction and non-conduction.

The present disclosure provides an acoustic wave filter device, an RF front-end circuit, and a communication apparatus that make it possible to improve the attenuation provided on the lower side of the pass band when the attenuation pole located on the lower side of the pass band and created by the resonant frequency of a parallel-arm resonant circuit is shifted higher in frequency.

According to an aspect of the present disclosure, there is provided an acoustic wave filter device that has a first input/output terminal and a second input/output terminals The acoustic wave filter device includes a first series-arm resonant circuit located on a path that connects the first input/output terminal with the second input/output terminal. The first series-arm resonant circuit includes a first series-arm resonator, and a first parallel-arm resonant circuit is connected to a first node and to ground. The first node is located on the path and is positioned between the second input/output terminal and the first series-arm resonant circuit. The first parallel-arm resonant circuit includes a first parallel-arm resonator, and a first switching circuit is connected in series with the first parallel-arm resonator between the first parallel-arm resonator and ground. The first switching circuit allows tuning of a resonant frequency of the first parallel-arm resonant circuit. The first switching circuit includes a first impedance element, and a first switching element is connected in parallel with the first impedance element. The acoustic wave filter device further includes a first transmission line located on the path and positioned between the first input/output terminal and the first series-arm resonant circuit, and a second transmission line that is connected in series between the first parallel-arm resonator and the first impedance element or is connected in series between the first parallel-arm resonator and the first switching element. The first transmission line and the second transmission line are in magnetic coupling with each other.

According to one aspect of the present disclosure, there is provided an acoustic wave filter device that has a first input/output terminal and a second input/output terminal. The acoustic wave filter device includes a first resonant circuit located on a first path and including one or more series-arm resonators. The first path connects the first input/output terminal with the second input/output terminal. A second resonant circuit is located on a second path that connects a node with ground. The node is located between at least one series-arm resonator of the one or more series-arm resonators and the second input/output terminal, a first interconnect line, and a second interconnect line. The second resonant circuit includes at least one first parallel-arm resonator formed by an acoustic wave resonator, and a frequency-tuning circuit connected between the at least one first parallel-arm resonator and ground. The frequency-tuning circuit allows tuning of a resonant frequency of the first parallel-arm resonator connected to the frequency-tuning circuit. The frequency-tuning circuit includes an impedance element connected between the first parallel-arm resonator and ground, and a switching element connected in parallel with the impedance element between the first parallel-arm resonator and ground. The first interconnect line is an interconnect line connected to a portion of the series-arm resonator located adjacent to the first input/output terminal. The second interconnect line is an interconnect line connecting the parallel-arm resonator with the switching element or is an interconnect line connecting the parallel-arm resonator with the impedance element. A first transmission line formed by the first interconnect line, and a second transmission line formed by the second interconnect line are in magnetic coupling with each other.

The above-mentioned configuration allows the resonant frequency of the first parallel-arm resonant circuit (second resonant circuit) to be shifted higher or lower in response to switching of the first switching element between conduction and non-conduction. Consequently, the attenuation pole located on the lower side of the pass band and created by the resonant frequency of the first parallel-arm resonant circuit can be shifted (tuned) in frequency. This makes it possible to achieve a frequency-tunable acoustic wave filter device (tunable filter) that can be switched between first and second filter characteristics. With the tunable filter described above, when the resonant frequency of the first parallel-arm resonant circuit is shifted higher by switching the first switching element between conduction and non-conduction, an additional attenuation pole is created on the lower side of the pass band due to the magnetic coupling between the first transmission line and the second transmission line.

Therefore, the above-mentioned configuration helps improve the attenuation provided on the lower side of the pass band when the attenuation pole located on the lower side of the pass band and created by the resonant frequency of the parallel-arm resonant circuit is shifted higher in frequency.

In another possible configuration, a signal input from one of the first input/output terminal and the second input/output terminal is output from the other one of the first input/output terminal and the second input/output terminal as a first signal without necessarily being routed through a path created by the magnetic coupling. A signal input from one of the first input/output terminal and the second input/output terminal is output from the other one of the first input/output terminal and the second input/output terminal as a second signal by being routed through a path created by the magnetic coupling. The magnetic coupling is such that when a resonant frequency of the first parallel-arm resonant circuit is shifted higher by switching the first switching element between conduction and non-conduction, the first signal and the second signal are opposite in phase and equal in amplitude at a predetermined frequency that lies within a stop band of the acoustic wave filter device.

Consequently, when the attenuation pole located on the lower side of the pass band and created by the resonant frequency of the parallel-arm resonant circuit is shifted higher in frequency, in the stop band on the lower side of the pass band, the first signal and the second signal cancel each other out, thus creating an additional attenuation pole. Therefore, the above-mentioned configuration helps improve the attenuation provided on the lower side of the pass band when the attenuation pole located on the lower side of the pass band and created by the resonant frequency of the first parallel-arm resonant circuit is shifted higher in frequency.

In another possible configuration, on the path, the first series-arm resonant circuit and the first parallel-arm resonant circuit that have resonant characteristics in a pass band and a stop band of the acoustic wave filter device are connected neither between the first input/output terminal and the first transmission line nor between the first node and the second input/output terminal.

This configuration helps improve the attenuation provided on the lower side of the pass band when the attenuation pole located on the lower side of the pass band and created by the resonant frequency of the parallel-arm resonant circuit is shifted higher in frequency, without necessarily increasing the size of the acoustic wave filter device.

In another possible configuration, the acoustic wave filter device further includes a second series-arm resonant circuit located on the path and positioned between the first node and the second input/output terminal. The second series-arm resonant circuit includes a second series-arm resonator, and a second parallel-arm resonant circuit is connected to a second node and to ground. The second node is located on the path and is positioned between the second input/output terminal and the second series-arm resonant circuit. The second parallel-arm resonant circuit includes a second parallel-arm resonator, and a second switching circuit is connected in series with the second parallel-arm resonator between the second parallel-arm resonator and ground. The second switching circuit allows tuning of a resonant frequency of the second parallel-arm resonant circuit. The second switching circuit includes a second impedance element, and a second switching element is connected in parallel with the second impedance element. The acoustic wave filter device further includes a third transmission line. The third transmission line is connected in series between the second parallel-arm resonator and the second impedance element or is connected in series between the second parallel-arm resonator and the second switching element. The first transmission line and the third transmission line are in magnetic coupling with each other.

In another possible configuration, the acoustic wave filter device further includes a second parallel-arm resonant circuit connected to a second node and to ground. The second node is located on the path and is positioned between the first transmission line and the first series-arm resonant circuit. The second parallel-arm resonant circuit includes a second parallel-arm resonator, and a second switching circuit is connected in series with the second parallel-arm resonator between the second parallel-arm resonator and ground. The second switching circuit allows tuning of a resonant frequency of the second parallel-arm resonant circuit. The second switching circuit includes a second impedance element, and a second switching element is connected in parallel with the second impedance element. The acoustic wave filter device further includes a fourth transmission line located on the path and positioned between the first node and the second input/output terminal, and a third transmission line that is connected in series between the second parallel-arm resonator and the second impedance element or is connected in series between the second parallel-arm resonator and the second switching element. The third transmission line and the fourth transmission line are in magnetic coupling with each other.

In another possible configuration, the acoustic wave filter device further includes a fifth transmission line located on the path and positioned between the first transmission line and the first series-arm resonant circuit, a series-arm circuit located on the path and positioned between the first transmission line and the fifth transmission line, and a parallel-arm circuit connected to a node and to ground. The node is located on the path and positioned between the first transmission line and the fifth transmission line. The second transmission line and the fifth transmission line are in magnetic coupling with each other.

Consequently, when the resonant frequency of each of the first parallel-arm resonant circuit and the second parallel-arm resonant circuit is shifted higher by switching each of the first switching element and the second switching element between conduction and non-conduction, the attenuation pole generated due to each of the magnetic coupling between the first and second transmission lines and the magnetic coupling between the first and third transmission lines moves closer to the pass band, thus improving attenuation on the lower side of the pass band and on the higher side of the pass band.

In another possible configuration, the impedance element is a capacitor.

This configuration makes it possible to achieve a frequency-tunable acoustic wave filter device (tunable filter) in which, when the first switching element is placed in a conducting state, the attenuation pole on the lower side of the pass band is shifted lower in frequency, and when the first switching element is placed in a non-conducting state, the attenuation pole on the lower side of the pass band is shifted higher in frequency.

In another possible configuration, the impedance element is an inductor.

This configuration makes it possible to achieve a frequency-tunable acoustic wave filter device (tunable filter) in which, when the first switching element is placed in a conducting state, the attenuation pole on the lower side of the pass band is shifted higher in frequency, and when the first switching element is placed in a non-conducting state, the attenuation pole on the lower side of the pass band is shifted lower in frequency.

In another possible configuration, the first impedance element is an acoustic wave resonator.

This configuration makes it possible to achieve a frequency-tunable acoustic wave filter device (tunable filter) in which, when the first switching element is placed in a conducting state, the attenuation pole on the lower side of the pass band is shifted lower in frequency, and when the first switching element is placed in a non-conducting state, the attenuation pole on the lower side of the pass band is shifted higher in frequency and the attenuation on the higher side of the pass band is improved.

In another possible configuration, the acoustic wave filter device further includes at least one package substrate and a wiring board. The first series-arm resonator, the first parallel-arm resonator, the second parallel-arm resonator, the first switching element, the second switching element, the first impedance element, and the second impedance element are provided inside, on the front side, or on the back side of the at least one package substrate. Each of the first transmission line and the second transmission line is provided in at least one of two locations, the two locations being one of the inside, the front side, and the back side of the at least one package substrate and one of the inside, the front side, and the back side of the wiring board.

This configuration makes it possible to achieve a compact acoustic wave filter device that improves the attenuation provided on the lower side of the pass band when the attenuation pole located on the lower side of the pass band and created by the resonant frequency of the first parallel-arm resonant circuit is shifted higher in frequency.

In another possible configuration, a portion of the first transmission line, and a portion of the second transmission line are each formed by a conductor, the conductor having at least one of Cu, Ag, Al, Ni, W, and Mo as a main component. The portion of the first transmission line and the portion of the second transmission line are provided in parallel with each other with no other intervening conductor, in at least one of two locations, the two locations being one of the inside, the front side, and the back side of the at least one package substrate and one of the inside, the front side, and the back side of the wiring board.

Consequently, the value of magnetic coupling between the first transmission line and the second transmission line can be increased. This helps improve the attenuation provided on the lower side of the pass band when the attenuation pole located on the lower side of the pass band and created by the resonant frequency of the first parallel-arm resonant circuit is shifted higher in frequency.

In another possible configuration, a portion of the second transmission line is provided inside the wiring board or on the front side of the wiring board. A portion of the first transmission line is provided inside the wiring board closer to the back side of the wiring board than is the portion of the second transmission line located inside the wiring board or is provided on the back side of the wiring board.

Consequently, the second transmission line can be reduced in length. This helps improve the attenuation provided on the lower side of the pass band when the attenuation pole located on the lower side of the pass band and created by the resonant frequency of the first parallel-arm resonant circuit is shifted higher in frequency.

According to one aspect of the present disclosure, there is provided a multiplexer including a plurality of filters including the acoustic wave filter device that has the above-mentioned characteristics. One input/output terminal of each of the plurality of filters is directly or indirectly connected to a common terminal.

This configuration makes it possible to provide a multiplexer that improves the attenuation provided on the lower side of the pass band when the attenuation pole located on the lower side of the pass band and created by the resonant frequency of the first parallel-arm resonant circuit is shifted higher in frequency.

According to one aspect of the present disclosure, there is provided an RF front-end circuit including the acoustic wave filter device having the above-mentioned characteristics or the multiplexer having the above-mentioned characteristics, and an amplifier circuit connected to the acoustic wave filter device or the multiplexer.

This configuration makes it possible to provide an RF front-end circuit that improves the attenuation provided on the lower side of the pass band when the attenuation pole located on the lower side of the pass band and created by the resonant frequency of the first parallel-arm resonant circuit is shifted higher in frequency.

According to one aspect of the present disclosure, there is provided a communication apparatus including an RF integrated circuit that processes an RF signal transmitted and received by an antenna element, and the RF front-end circuit having the above-mentioned characteristics, the RF front-end circuit transmitting the RF signal between the antenna element and the RF integrated circuit.

This configuration makes it possible to provide a communication apparatus that improves the attenuation provided on the lower side of the pass band when the attenuation pole located on the lower side of the pass band and created by the resonant frequency of the first parallel-arm resonant circuit is shifted higher in frequency.

Advantageous Effects of Disclosure

The present disclosure provides an acoustic wave filter device, an RF front-end circuit, and a communication apparatus that make it possible to improve the attenuation provided on the lower side of the pass band when the attenuation pole located on the lower side of the pass band and created by the resonant frequency of the first parallel-arm resonant circuit is shifted higher in frequency.

DETAILED DESCRIPTION

Figure 1:
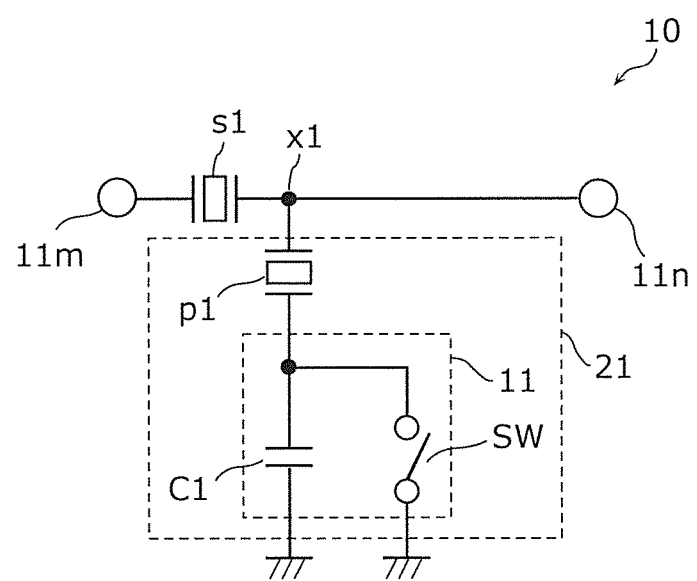
FIG. 1 illustrates the circuit configuration of a filter device according to Embodiment 1.

Embodiments of the present disclosure will be described below. Embodiments described below, each represents one exemplary implementation of the present disclosure. Accordingly, features presented in the following embodiments, such as numerical values, shapes, materials, components, and the placement and connection of components, are illustrative only and not intended to be limiting of the present disclosure. Therefore, of the components illustrated in the following embodiments, those components not described in the independent claim representing the broadest concept of the present disclosure will be described as optional components.

The drawings are schematic and not necessarily illustrated precisely. Throughout the drawings, identical reference signs are used to designate substantially identical elements, and repetitive description will be omitted or simplified.

As used hereinafter, the expression "lower end of the pass band" means "lowermost frequency within the pass band". The expression "higher end of the pass band" means "uppermost frequency within the pass band". Further, as used hereinafter, the expression "lower side of the pass band" means "frequencies outside and below the pass band". The expression "higher side of the pass band" means "frequencies outside and above the pass band". Hereinafter, "lower frequency side" will be sometimes referred to as "lower side", and "higher frequency side" will be sometimes referred to as "higher side".

The resonant frequency of a resonator refers to the frequency of the "resonant point", which is the singular point at which the impedance of the resonator has a local minimum (ideally the point of zero impedance). The anti-resonant frequency of a resonator refers to the frequency at the "anti-resonant point", which is the singular point at which the impedance of the resonator has a local maximum (ideally the point of infinite impedance). For the convenience of explanation, in the following description, not only for a single resonator used alone but also for a circuit made up of a plurality of resonators or impedance elements, the singular point at which the impedance has a local minimum (ideally the point of zero impedance) will be referred to as "resonant point", and the frequency at the resonant point will be referred to as "resonant frequency". The singular point at which the impedance has a local maximum (ideally the point of infinite impedance) will be referred to as "anti-resonant point", and the frequency at the anti-resonant point will be referred to as "anti-resonant frequency". In the following description, not only for a resonator but also for a resonant circuit, the frequency at which the impedance has a local minimum will be referred to as "resonant frequency", and the frequency at which the impedance has a local maximum will be referred to as "anti-resonant frequency".

The following description assumes that the switching element is an ideal element that exhibits infinite impedance in a conducting state (ON) and exhibits zero impedance in a non-conducting state (OFF). In actuality, the switching element has parasitic components, such as capacitance components in a non-conducting state, inductance components in a conducting state, and resistance components. Therefore, the characteristics of an actual switching element slightly differ from the characteristics of such an ideal switching element.

Embodiment 1

An embodiment of the present disclosure will be described below with reference to FIGS. 1 to 4B.

[1-1. Configuration of Filter Device]

First, a filter device 10 according to Embodiment 1 will be described.

The filter device 10 is, for example, an RF filter circuit disposed at the front-end section of a multimode/multiband-capable cellular phone. The filter device 10 is a bandpass filter that is incorporated in a multiband-capable cellular phone compliant with a communication standard such as Long Term Evolution (LTE), and selectively passes RF signals within a predetermined band of frequencies. The filter device 10 is an acoustic wave filter device employing an acoustic wave resonator.

FIG. 1 illustrates the circuit configuration of the filter device 10 according to Embodiment 1. In the circuit configuration diagram of FIG. 1, circuit components of the filter device that are identical in configuration when drawn in a circuit diagram are collectively depicted. Accordingly, the actual structure of the filter device 10 varies depending on the transmission lines to be magnetically coupled.

As illustrated in FIG. 1, the filter device 10 includes an input/output terminal 11m, and an input/output terminal 11n. The input/output terminal 11m corresponds to a first input/output terminal, and the input/output terminal 11n corresponds to a second input/output terminal. A series-arm resonator s1 is connected on a path that connects the input/output terminal 11m with the input/output terminal 11n. A parallel-arm resonant circuit 21 is connected between a node x1 and ground (reference terminal). The node x1 is located on the path that connects the input/output terminal 11m with the input/output terminal 11n and positioned between the input/output terminal 11n and the series-arm resonator s1. The series-arm resonator s1 corresponds to a first series-arm resonator. Further, the series-arm resonator s1 corresponds to a first series-arm resonant circuit having a first series-arm resonator and corresponds to a first resonant circuit. The parallel-arm resonant circuit 21 corresponds to a first parallel-arm resonant circuit and a second resonant circuit, and the node x1 corresponds to a first node.

The parallel-arm resonant circuit 21 has a parallel-arm resonator p1, and a frequency-tuning circuit 11. The frequency-tuning circuit 11 is connected in series with the parallel-arm resonator p1 between the parallel-arm resonator p1 and ground. The parallel-arm resonator p1 corresponds to a first parallel-arm resonator, and the frequency-tuning circuit 11 corresponds to a first switching circuit. The frequency-tuning circuit 11 includes a capacitor C1, and a switching element SW connected in parallel with the capacitor C1. The capacitor C1 corresponds to a first impedance element, and the switching element SW corresponds to a first switching element. With the filter device 10, the resonant frequency of the parallel-arm resonant circuit 21 is shifted (tuned) by switching the switching element SW of the frequency-tuning circuit 11 between conduction and non-conduction.

The transmission line located on the path that connects the input/output terminal 11m with the input/output terminal 11n and positioned between the input/output terminal 11m and the series-arm resonator s1 corresponds to a first transmission line. The transmission line connected in series between the parallel-arm resonator p1 and the capacitor C1, or the transmission line connected in series between the parallel-arm resonator p1 and the switching element SW corresponds to a second transmission line. The first transmission line is formed by a first interconnect line, and the second transmission line is formed by a second interconnect line. The first interconnect line is an interconnect line connected to the portion of the series-arm resonator s1 that is located adjacent to the first input/output terminal 11m. The second interconnect line is an interconnect line that connects the parallel-arm resonator p1 with the switching element SW, or an interconnect line that connects the parallel-arm resonator p1 with the capacitor C1. The first transmission line and the second transmission line are magnetically coupled with each other. As for the circuit of the filter device 10 with such magnetic coupling, examples of such circuits will be described later.

In the filter device 10, a resonant circuit having resonant characteristics is connected neither between the input/output terminal 11m and the series-arm resonator s1, nor between the node x1 and the input/output terminal 11n.

The series-arm resonator s1 and the parallel-arm resonator p1 are resonators (acoustic wave resonators) employing acoustic waves. Examples of such resonators include resonators employing surface acoustic waves (SAWs), and resonators employing bulk acoustic waves (BAWs). Examples of SAWs include not only surface acoustic waves but also boundary waves.

Although the series-arm resonator s1 and the parallel-arm resonator p1 are each formed by a single acoustic wave resonator in Embodiment 1, the series-arm resonator s1 and the parallel-arm resonator p1 may be each formed by a plurality of acoustic wave resonators. Examples of a series-arm resonator made up of a plurality of acoustic wave resonators include a longitudinally coupled resonator made up of a plurality of acoustic wave resonators. Using such a longitudinally coupled resonator enables adaptation to filter characteristics for which, for example, attenuation enhancement is required. Examples of series-arm and parallel-arm resonators made up of a plurality of acoustic wave resonators include a resonator made up of a plurality of split resonators obtained by, for example, serially splitting a single acoustic wave resonator. Using such a resonator enables adaptation to filter characteristics for which enhanced electric power handling capability is required.

The parallel-arm resonator p1 may be any resonator or circuit that is represented by an equivalent circuit model (e.g., BVD model) made up of inductance and capacitance components and has resonant and anti-resonant frequencies.

Now, the configuration of a surface acoustic wave resonator (SAW resonator) will be described as an example of each of the series-arm resonator s1 and the parallel-arm resonator p1. In the following, the series-arm resonator s1 will be described by way of example.

Figure 2:
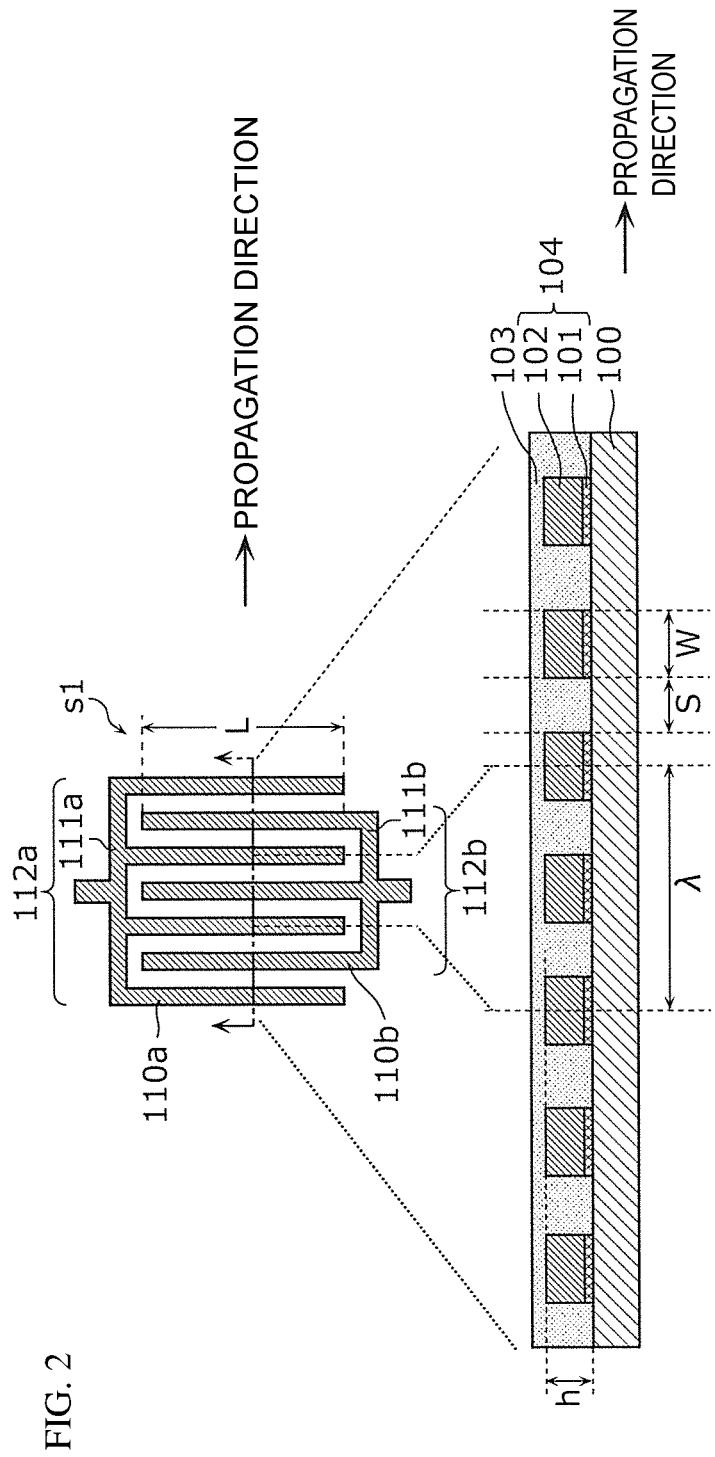
FIG. 2 schematically illustrates, in plan and in cross-section, an exemplary configuration of a surface acoustic wave resonator in a filter device according to Embodiment 1.

FIG. 2 schematically illustrates, in plan and in cross-section, an exemplary configuration of a surface acoustic wave element in the filter device 10 according to Embodiment 1. FIG. 2 schematically illustrates, in plan and in cross-section, the configuration of the series-arm resonator s1 among resonators that constitute the filter device 10. The series-arm resonator s1 in FIG. 2 is illustrated for the purpose of explaining a typical resonator configuration. Accordingly, features such as the number and length of electrode fingers constituting each electrode are not limited to those depicted in FIG. 2.

As illustrated in FIG. 2, the series-arm resonator s1 includes a substrate 100 having piezoelectric property, and IDT electrodes 112a and 112b having a comb-like shape.

As illustrated in the plan view of FIG. 2, a pair of mutually-opposed interdigital transducers (IDT) electrode 112a and 112b is provided over the substrate 100 having piezoelectric property. The IDT electrode 112a includes a plurality of mutually-parallel electrode fingers 110a, and a busbar electrode 111a connecting the plurality of electrode fingers 110a. The IDT electrode 112b includes a plurality of mutually-parallel electrode fingers 110b, and a busbar electrode 111b connecting the plurality of electrode fingers 110b. The plurality of electrode fingers 110a and the plurality of electrode fingers 110b are disposed in a direction orthogonal to the direction of wave propagation.

An IDT electrode 104, which includes the plurality of electrode fingers 110a and the plurality of electrode fingers 110b as well as the busbar electrodes 111a and 111b, has a multilayer structure as illustrated in the cross-sectional view of FIG. 2. The multilayer structure includes an adhesion layer 101 and a main electrode layer 102.

The adhesion layer 101 serves to improve the adhesion between the substrate 100 having piezoelectric property and the main electrode layer 102. The adhesion layer 101 is made of, for example, Ti. The adhesion layer 101 has a film thickness of, for example, 12 nm.

The main electrode layer 102 is made of, for example, Al containing 1% of Cu. The main electrode layer 102 has a film thickness of, for example, 162 nm.

A protective layer 103 is formed so as to cover the IDT electrodes 112a and 112b. The protective layer 103 is provided for purposes such as protecting the main electrode layer 102 from the external environment, adjusting frequency-temperature characteristics, and enhancing moisture resistance. The protective layer 103 is made of, for example, silicon dioxide as a main component.

The respective materials of the adhesion layer 101, the main electrode layer 102, and the protective layer 103 are not limited to the materials mentioned above. Further, the IDT electrode 104 including the adhesion layer 101 and the main electrode layer 102 may not have the above-mentioned multilayer structure. The IDT electrode 104 may be made of a metal such as Ti, Al, Cu, Pt, Au, Ag, or Pd, or an alloy thereof. Alternatively, the IDT electrode 104 may be formed by a plurality of multilayer bodies made of the above-mentioned metal or alloy. The adhesion layer 101 and the protective layer 103 may not be provided.

The substrate 100 having piezoelectric property is made of, for example, a $LiTaO_3$ piezoelectric single crystal, a $LiNbTaO_3$ piezoelectric single crystal, or a piezoelectric ceramic material. At least the surface of the substrate 100 has piezoelectric property. In one exemplary configuration, the surface of the substrate may be provided with a piezoelectric thin film, and the substrate may be formed by a multilayer body made up of a film having a different acoustic velocity from the piezoelectric thin film, a support substrate, and other components. In another exemplary configuration, the substrate may be formed as one of the following multilayer bodies: a multilayer body including a high acoustic velocity support substrate, and a piezoelectric thin film provided over the high acoustic velocity support substrate; a multilayer body including a high acoustic velocity support substrate, a low acoustic velocity film provided over the high acoustic velocity support substrate, and a piezoelectric thin film provided over the low acoustic velocity film; and a multilayer body including a support substrate, a high acoustic velocity film provided over the support substrate, a low acoustic velocity film provided over the high acoustic velocity film, and a piezoelectric thin film provided over the low acoustic velocity film. The entirety of the substrate may have piezoelectric property.

The series-arm resonator s1 may not necessarily be configured as illustrated in FIG. 2. For example, instead of being formed as a multilayer metal-film structure, the IDT electrode 104 may be formed as a single metal-film layer. The configuration of the parallel-arm resonator p1 is identical or similar to the configuration of the series-arm resonator s1 and thus will not be described in further detail.

The capacitor C1 is connected between the node x1 and ground (reference terminal).

The switching element SW is a switching element that constitutes the frequency-tuning circuit 11 together with the capacitor C1. In Embodiment 1, the switching element SW is connected in parallel with the capacitor C1. For example, to achieve miniaturization, the switching element SW is formed by a field effect transistor (FET) switching element implemented in GaAs or complementary metal oxide semiconductor (CMOS), or by a diode switching element. The switching element SW becomes conducting or non-conducting in accordance with a control signal from a controller such as an RF integrated circuit (RFIC).

The presence of the frequency-tuning circuit 11 allows the filter device 10 to be implemented as a tunable filter whose pass band and attenuation poles can be shifted in frequency in response to switching of the switching element SW between conduction and non-conduction.

Specifically, the pass band of the filter device 10 is formed by placing the anti-resonant frequency of the parallel-arm resonant circuit 21 and the resonant frequency of the series-arm resonator s1 in close proximity to each other. The attenuation pole and attenuation slope on the lower side of the pass band of the filter device 10 are defined by the resonant frequency of the parallel-arm resonant circuit 21, and the attenuation pole and attenuation slope on the higher side of the pass band are defined by the anti-resonant frequency of the series-arm resonator s1. In this case, in the parallel-arm resonant circuit 21, the capacitor C1 functions with respect to the parallel-arm resonator p1 only when the switching element SW is in a non-conducting state. Consequently, the resonant frequency of the parallel-arm resonant circuit 21 is equal to the resonant frequency of the parallel-arm resonator p1 when the switching element SW is placed in a conducting state and shifts to a frequency higher than the resonant frequency of the parallel-arm resonator p1 when the switching element SW is placed in a non-conducting state. The frequency-tuning range of each of the attenuation pole and pass band of the filter device 10 is dependent on the constant of the capacitor C1. For example, the frequency-tuning range increases as the constant of the capacitor C1 decreases. Accordingly, the constant (capacitance value) of the capacitor C1 may be determined as appropriate in accordance with frequency specifications required for the filter device 10.

As a result of the above configuration, the filter device 10 allows the attenuation pole on the lower side of the pass band to shift higher in frequency in response to switching of the switching element SW from conduction to non-conduction. That is, with the filter device 10, the attenuation pole on the lower side of the pass band, and the pass band can be shifted in frequency in response to switching of the switching element SW between conduction and non-conduction.

Although the description of Embodiment 1 is directed to a case in which the first impedance element is a capacitor, the first impedance element may be an inductor. In that case, the inductor serving as a first impedance element functions with respect to the parallel-arm resonator p1 only when the switching element SW is in a non-conducting state. Consequently, the resonant frequency of the parallel-arm resonant circuit 21 is equal to the resonant frequency of the parallel-arm resonator p1 when the switching element SW is placed in a conducting state and shifts to a frequency lower than the resonant frequency of the parallel-arm resonator p1 when the switching element SW is placed in a non-conducting state.

Figure 3A:
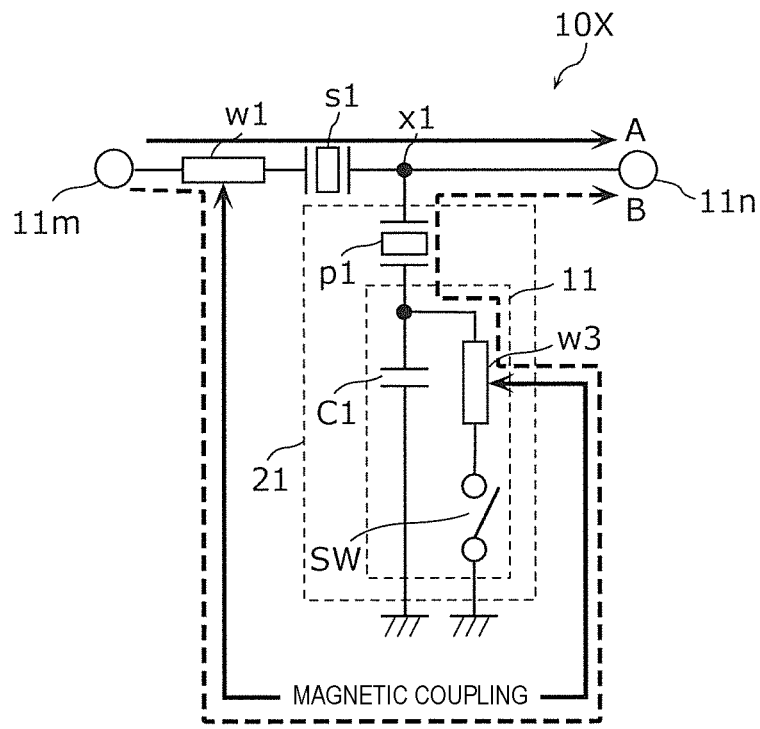
FIG. 3A illustrates an exemplary circuit of a filter device according to Embodiment 1 in which two transmission lines are magnetically coupled.
Figure 3B:
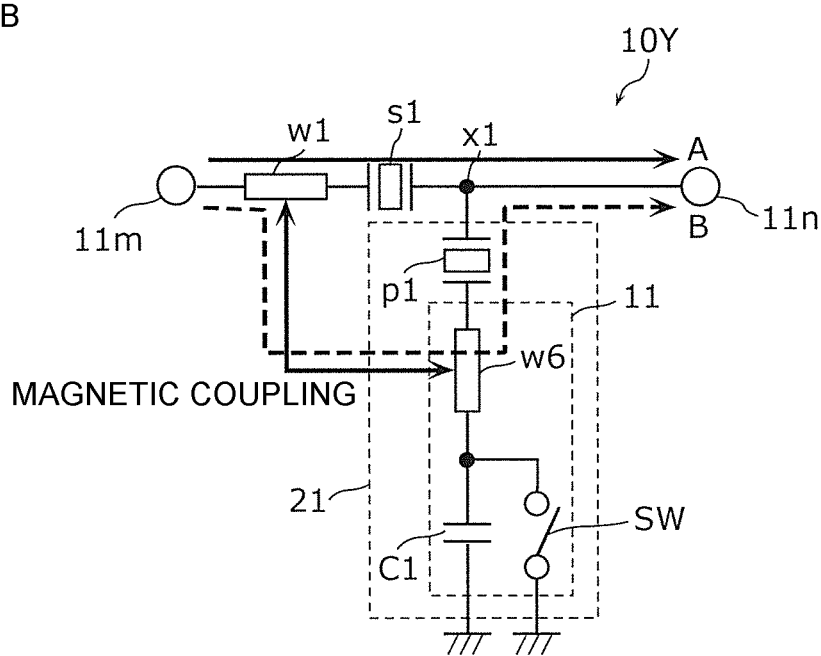
FIG. 3B illustrates another exemplary circuit of a filter device according to Embodiment 1 in which two transmission lines are magnetically coupled.

FIGS. 3A and 3B each illustrate an exemplary circuit of a filter device in which two transmission lines are magnetically coupled.

A filter device 10X illustrated in FIG. 3A has a transmission line w1. The transmission line w1 is located on the path that connects the input/output terminal 11m with the input/output terminal 11n and connected in series between the input/output terminal 11m and the series-arm resonator s1. Further, the filter device 10X has a transmission line w3 connected in series between the parallel-arm resonator p1 and the switching element SW. A series circuit of the transmission line w3 and the switching element SW, and the capacitor C1 are connected in parallel. The transmission line w1 corresponds to a first transmission line, and the transmission line w3 corresponds to a second transmission line. The transmission line w1 and the transmission line w3 are magnetically coupled when the switching element SW is in a non-conducting state.

As described above, when the switching element SW is in a non-conducting state, the transmission line w1 and the transmission line w3 are magnetically coupled. As a result, Path B that goes through the magnetically coupled transmission lines w1 and w3 is created between the input/output terminal 11m and the input/output terminal 11n as illustrated in FIG. 3A. That is, in the filter device 10X, the following paths are created as propagation paths for RF signals: Path A that passes through the series arm connecting the input/output terminal 11m with the input/output terminal 11n; and Path B that passes through the input/output terminal 11n from the input/output terminal 11m via the transmission line w1 and the transmission line w3 due to the magnetic coupling. Path A corresponds to a first path, and Path B corresponds to a second path. Consequently, in the stop band on the lower side of the pass band of the filter device 10X, a first signal that follows Path A, and a second signal that follows Path B cancel each other out, resulting in improved attenuation. By contrast, when the switching element SW is in a conducting state, the switching element SW exhibits low impedance (ideally 0Ω). Consequently, there is hardly any magnetic coupling between the transmission line w1 and the transmission line w3. The transmission line w1 and the transmission line w3 thus exert hardly any influence on the characteristics of the filter device 10X.

It is to be noted that on the path between the input/output terminal 11m and the transmission line w1 and on the path between the node x1 and the input/output terminal 11n, no series-arm and parallel-arm resonant circuits that have resonant characteristics in the pass band and stop band of the filter device 10X are connected.

The above-mentioned configuration helps improve the attenuation provided on the lower side of the pass band of the filter device 10X when the switching element SW is in a non-conducting state. In other words, the above-mentioned configuration helps improve the attenuation provided on the lower side of the pass band when the attenuation pole located on the lower side of the pass band and created by the resonant frequency of the first parallel-arm resonant circuit is shifted higher in frequency.

The configuration of the filter device 10 is not limited to one in which the transmission line w1 and the transmission line w3 are magnetically coupled. Alternatively, as with a filter device 10Y illustrated in FIG. 3B, the transmission line w1 connected in series between the input/output terminal 11m and the series-arm resonator s1, and a transmission line w6 connected in series between the parallel-arm resonator p1 and the capacitor C1 may be magnetically coupled. Specifically, a series circuit of the parallel-arm resonator p1 and the transmission line w6, and a parallel circuit of the switching element SW and the capacitor C1 are connected in series. The transmission line w1 corresponds to a first transmission line, and the transmission line w6 corresponds to a second transmission line.

When the switching element SW is in a non-conducting state, the transmission line w1 and the transmission line w6 are magnetically coupled. As a result, Path B that goes through the magnetically coupled transmission lines w1 and w6 is created between the input/output terminal 11m and the input/output terminal 11n as illustrated in FIG. 3B. That is, in the filter device 10Y, the following paths are created as propagation paths for RF signals: Path A that passes through the series arm connecting the input/output terminal 11m with the input/output terminal 11n; and Path B that passes through the input/output terminal 11n from the input/output terminal 11m via the transmission line w1 and the transmission line w6 due to the magnetic coupling. Consequently, in the stop band on the lower side of the pass band of the filter device 10Y, a first signal that follows Path A, and a second signal that follows Path B cancel each other out, resulting in improved attenuation.

By contrast, when the switching element SW is in a conducting state, the switching element SW exhibits low impedance (ideally OS)). Consequently, there is hardly any magnetic coupling between the transmission line w1 and the transmission line w6. The transmission line w1 and the transmission line w6 thus exert hardly any influence on the characteristics of the filter device 10Y.

In another possible configuration, the transmission line w6 is connected in series between the parallel-arm resonator p1 and the capacitor C1, and the series circuit of the transmission line w6 and the capacitor C1 is connected in parallel with the switching element SW.

This configuration helps improve the attenuation provided on the lower side of the pass band of the filter device 10Y when the switching element SW is in a non-conducting state, even for cases where it is not possible to magnetically couple the transmission line w1 and the transmission line w6. In other words, this configuration helps improve the attenuation provided on the lower side of the pass band when the attenuation pole located on the lower side of the pass band and created by the resonant frequency of the first parallel-arm resonant circuit is shifted higher in frequency.

[1-2. Filtering Characteristics of Filter During Non-Conduction of Switching Element]

The filtering characteristics of the filter device 10X illustrated in FIG. 3A will be described below. The following describes the bandpass characteristics when the switching element SW is in a non-conducting state. In other words, the following describes the bandpass characteristics when the attenuation pole located on the lower side of the pass band and created by the resonant frequency of the parallel-arm resonant circuit 21 (first parallel-arm resonant circuit) is shifted higher in frequency.

The filtering characteristics of the filter device 10Y illustrated in FIG. 3B are substantially identical to the filtering characteristics of the filter device 10X and thus will not be described in further detail.

Figure 4A:
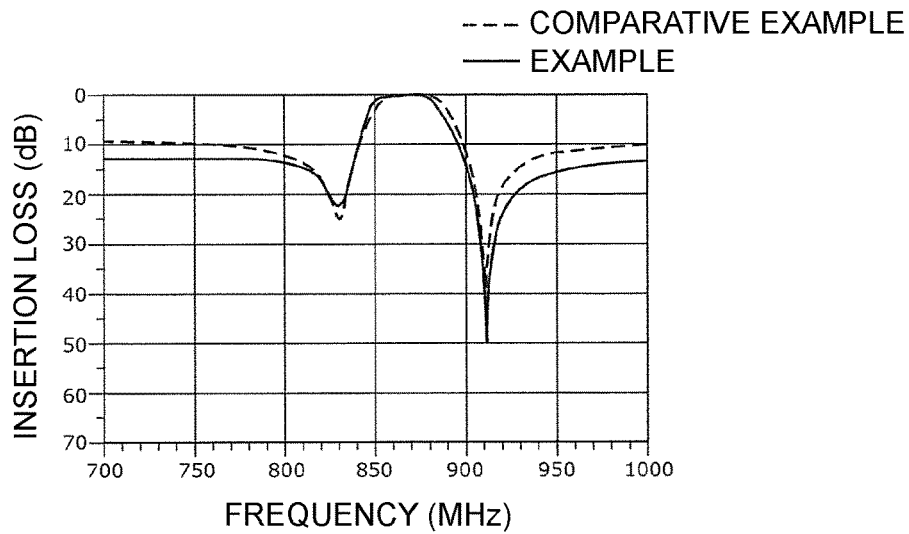
FIG. 4A is a graph illustrating the bandpass characteristics of a filter device according to Embodiment 1 during non-conduction of a switching element.

FIG. 4A is a graph illustrating the bandpass characteristics of the filter device 10X according to Embodiment 1 when the switching element SW is in a non-conducting state. In FIG. 4A, the solid line represents the insertion loss of the filter device 10X when the switching element SW is in a non-conducting state and magnetic coupling is present between the transmission line w1 and the transmission line w3 (indicated as "Example" in FIG. 4A), and the dashed line represents the insertion loss of the filter device 10X when the switching element SW is in a non-conducting state and no such magnetic coupling is present (indicated as "Comparative Example" in FIG. 4A).

As illustrated in FIG. 4A, with Example, the attenuation on the lower side of the pass band of the filter device 10X is improved in comparison with Comparative Example. That is, the magnetic coupling between the transmission line w1 and the transmission line w3 helps improve the attenuation provided on the lower side of the pass band.

[1-3. Filtering Characteristics of Filter Device During Conduction of Switching Element]

The following describes, with regard to the filtering characteristics of the filter device 10X illustrated in FIG. 3A, the bandpass characteristics when the switching element SW is in a conducting state. In other words, the following describes the bandpass characteristics when the attenuation pole located on the lower side of the pass band and created by the resonant frequency of the parallel-arm resonant circuit 21 (first parallel-arm resonant circuit) is shifted lower in frequency.

Figure 4B:
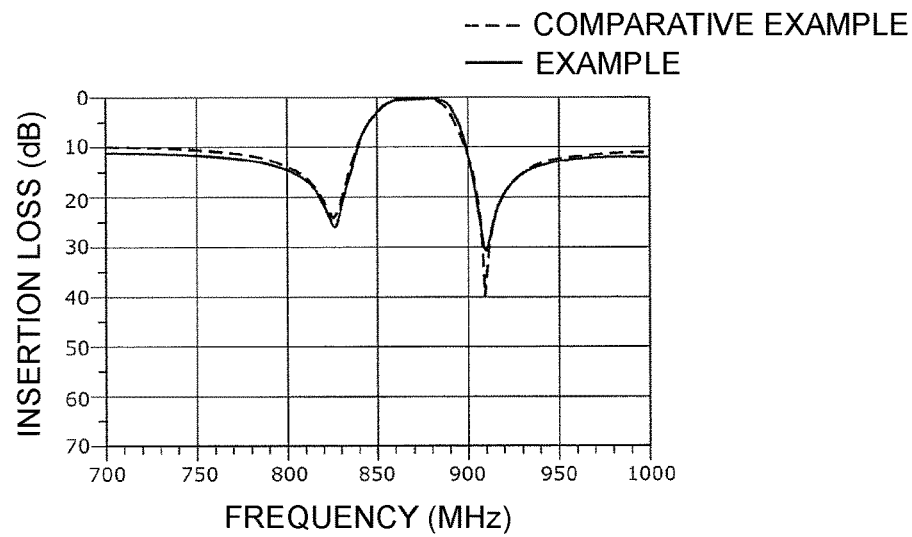
FIG. 4B is a graph illustrating the bandpass characteristics of a filter device according to Embodiment 1 during conduction of a switching element.

FIG. 4B is a graph illustrating the bandpass characteristics of the filter device 10X according to Embodiment 1 when the switching element SW is in a conducting state. In FIG. 4B, the solid line represents the insertion loss of the filter device 10X upon switching the switching element SW into conduction for a case in which the switching element SW is in a non-conducting state and magnetic coupling is present between the transmission line w1 and the transmission line w3 (indicated as "Example" in FIG. 4B), and the dashed line represents the insertion loss of the filter device 10X upon switching the switching element SW into conduction for a case in which the switching element SW is in a non-conducting state and no such magnetic coupling is present (indicated as "Comparative Example" in FIG. 4B).

The change in attenuation observed when the switching element SW is placed in a conducting state is not as great as that observed when the switching element SW is placed in a non-conducting state. It can be thus appreciated that in the filter device 10X, the magnetic coupling between the transmission line w1 and the transmission line w3 does not affect the attenuation characteristics exhibited by the filter device 10X when the switching element SW is in a conducting state.

[1-4. Advantages Etc.]

As described above, with the filter device 10 according to Embodiment 1, the transmission line between the input/output terminal 11m and the series-arm resonator s1 is magnetically coupled with the transmission line connected in series between the parallel-arm resonator p1 and the capacitor C1, or with the transmission line connected in series between the parallel-arm resonator p1 and the frequency-tuning circuit 11. This magnetic coupling helps improve the attenuation characteristics exhibited when the attenuation pole on the lower side of the pass band is shifted higher in frequency by switching the switching element SW of the parallel-arm resonant circuit 21 into non-conduction, without necessarily affecting the attenuation characteristics exhibited when the attenuation pole on the lower side of the pass band is shifted lower in frequency by switching the switching element SW of the parallel-arm resonant circuit 21 into conduction. The above-mentioned configuration makes it possible to improve the attenuation provided on the lower side of the pass band of the filter device 10 when the attenuation pole located on the lower side of the pass band and created by the resonant frequency of the parallel-arm resonant circuit 21 (first parallel-arm resonant circuit) is shifted higher in frequency. This helps improve the attenuation provided when the switching element SW is in a non-conducting state.

Embodiment 2

Next, Embodiment 2 will be described with reference to FIGS. 5 to 9B.

A filter device 1 according to Embodiment 2 differs from the filter device 10 according to Embodiment 1 in the presence of a plurality of series-arm resonant circuits and a plurality of parallel-arm resonant circuits. That is, the filter device 1 according to Embodiment 2 has the configuration of a multi-stage ladder filter.

The multi-stage ladder filter may be configured such that a second series-arm resonator and a second parallel-arm resonant circuit are added between a first transmission line and a first series-arm resonator or may be configured such that a second series-arm resonator and a second parallel-arm resonant circuit are added between a first input/output terminal and a first transmission line or between a first node and a second input/output terminal.

[2-1. Configuration of Filter Device]

Figure 5:
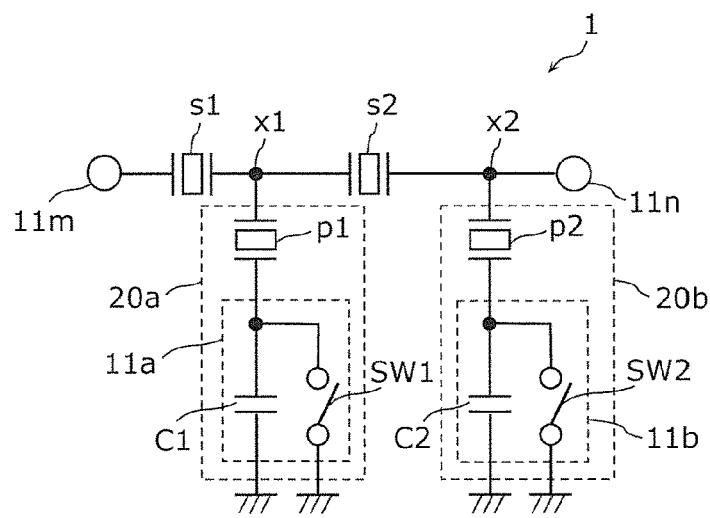
FIG. 5 illustrates the circuit configuration of a filter device according to Embodiment 2.

FIG. 5 illustrates the circuit configuration of the filter device 1 according to Embodiment 2.

As illustrated in FIG. 5, the filter device 1 includes series-arm resonators s1 and s2, and parallel-arm resonant circuits 20a and 20b. The parallel-arm resonant circuit 20a includes a parallel-arm resonator p1, and a frequency-tuning circuit 11a. The parallel-arm resonant circuit 20b includes a parallel-arm resonator p2, and a frequency-tuning circuit 11b. The frequency-tuning circuit 11a includes a capacitor C1 and a switching element SW1. The frequency-tuning circuit 11b includes a capacitor C2 and a switching element SW2.

The series-arm resonators s1 and s2 are each formed by an acoustic wave resonator. The series-arm resonators s1 and s2 are connected in this order as viewed from the input/output terminal 11m, on the path that connects the input/output terminal 11m with the input/output terminal 11n. Each of the series-arm resonators s1 and s2 represents a series-arm resonant circuit located on the path that connects the input/output terminal 11m with the input/output terminal 11n.

The parallel-arm resonant circuit 20a is a parallel-arm resonant circuit connected between a node x1 and ground (reference terminal). The node x1 is located on the path that connects the series-arm resonator s1 with the series-arm resonator s2. In the parallel-arm resonant circuit 20a, the parallel-arm resonator p1 and the frequency-tuning circuit 11a are connected in series, and the frequency-tuning circuit 11a is connected to ground. In the frequency-tuning circuit 11a, the capacitor C1 and the switching element SW1 are connected in parallel.

The parallel-arm resonant circuit 20b is a parallel-arm resonant circuit connected between a node x2 and ground (reference terminal). The node x2 is located on the path that connects the series-arm resonator s2 with the input/output terminal 11n. In the parallel-arm resonant circuit 20b, the parallel-arm resonator p2 and the frequency-tuning circuit 11b are connected in series, and the frequency-tuning circuit 11b is connected to ground. In the frequency-tuning circuit 11b, the capacitor C2 and the switching element SW2 are connected in parallel.

That is, the node x1 and the node x2 respectively correspond to a first node and a second node. Further, the parallel-arm resonant circuit 20a and the parallel-arm resonant circuit 20b respectively correspond to a parallel-arm resonant circuit positioned between the node x1 located on the above-mentioned path and ground, and a parallel-arm resonant circuit positioned between the node x2 located on the above-mentioned path and ground.

The parallel-arm resonator p1 has a resonant frequency below the pass band of the filter device 1 and has an anti-resonant frequency within the pass band. In Embodiment 2, the resonant frequency of the parallel-arm resonator p1 is lower than the resonant frequency of the series-arm resonator s1, and the anti-resonant frequency of the parallel-arm resonator p1 is lower than the anti-resonant frequency of the series-arm resonator s1.

Likewise, the parallel-arm resonator p2 has a resonant frequency below the pass band of the filter device 1 and has an anti-resonant frequency within the pass band. In Embodiment 2, the resonant frequency of the parallel-arm resonator p2 is lower than the resonant frequency of the series-arm resonator s2, and the anti-resonant frequency of the parallel-arm resonator p2 is lower than the anti-resonant frequency of the series-arm resonator s2.

In the filter device 1, the capacitor C1 is connected between the node x1, which is located on the path connecting the series-arm resonator s1 with the series-arm resonator s2, and ground (reference terminal).

In Embodiment 2, the parallel-arm resonator p1 and the capacitor C1 are connected in series. The series connection of the parallel-arm resonator p1 and the capacitor C1 is connected between the node x1, which is located on the path connecting the series-arm resonator s1 with the series-arm resonator s2, and ground. In Embodiment 2, one terminal of the parallel-arm resonator p1 is connected to the node x1, which is located on the path connecting the series-arm resonator s1 with the series-arm resonator s2, and the other terminal of the parallel-arm resonator p1 is connected to one terminal of the capacitor C1. One terminal of the capacitor C1 is connected to the other terminal of the parallel-arm resonator p1, and the other terminal of the capacitor C1 is connected to ground.

Further, in Embodiment 2, the switching element SW1 is connected to one terminal of the capacitor C1 and to the other terminal of the capacitor C1. The switching element SW1 is connected in parallel with the capacitor C1.

The parallel-arm resonator p1, the capacitor C1, and the switching element SW1 constitute the parallel-arm resonant circuit 20a.

The capacitor C2 is connected between the node x2, which is located on the path connecting the series-arm resonator s2 with the input/output terminal 11n, and ground (reference terminal).

In Embodiment 2, the parallel-arm resonator p2 and the capacitor C2 are connected in series. The series connection of the parallel-arm resonator p2 and the capacitor C2 is connected between the node x2, which is located on the path connecting the series-arm resonator s2 with the input/output terminal 11n, and ground. In Embodiment 2, one terminal of the parallel-arm resonator p2 is connected to the node x2, which is located on the path connecting the series-arm resonator s2 with the input/output terminal 11n, and the other terminal of the parallel-arm resonator p2 is connected to one terminal of the capacitor C2. One terminal of the capacitor C2 is connected to the other terminal of the parallel-arm resonator p2, and the other terminal of the capacitor C2 is connected to ground.

Further, in Embodiment 2, the switching element SW2 is connected to one terminal of the capacitor C2 and to the other terminal of the capacitor C2. The switching element SW2 is connected in parallel with the capacitor C2.

The parallel-arm resonator p2, the capacitor C2, and the switching element SW2 constitute the parallel-arm resonant circuit 20b.

The switching elements SW1 and SW2 are identical or similar in configuration to the switching element SW described above with reference to Embodiment 1. Further, the capacitors C1 and C2 are identical or similar in configuration to the capacitor C1 described above with reference to Embodiment 1.

In Embodiment 2, the frequency-tuning circuit 11a is connected in series with the parallel-arm resonator p1 at a position between the node x1, which is located on the path connecting the series-arm resonator s1 with the series-arm resonator s2, and ground. The frequency-tuning circuit 11b is connected in series with the parallel-arm resonator p2 at a position between the node x2, which is located on the path connecting the series-arm resonator s2 with the input/output terminal 11n, and ground.

The presence of the frequency-tuning circuits 11a and 11b allows the filter device 1 to be implemented as a tunable filter in which, in response to switching of the switching elements SW1 and SW2 between conduction and non-conduction, the respective resonant frequencies of the parallel-arm resonant circuits 20a and 20b are shifted to thereby shift the frequency of the attenuation pole on the lower side of the pass band and the frequency of the pass band.

Specifically, the pass band of the filter device 1 is created by placing the respective anti-resonant frequencies of the parallel-arm resonant circuits 20a and 20b and the respective resonant frequencies of the series-arm resonators s1 and s2 in close proximity to each other. The attenuation pole and attenuation slope on the lower side of the pass band of the filter device 1 are defined by the resonant frequency of each of the parallel-arm resonant circuits 20a and 20b, and the attenuation pole and attenuation slope on the higher side of the pass band are defined by the anti-resonant frequency of each of the series-arm resonators s1 and s2. In this case, the capacitor C1 and the capacitor C2 respectively function with respect to the parallel-arm resonator p1 and the parallel-arm resonator p2 only when the switching elements SW1 and SW2 are in a non-conducting state. Consequently, the respective resonant frequencies of the parallel-arm resonant circuits 20a and 20b are equal to the respective resonant frequencies of the parallel-arm resonators p1 and p2 when the switching elements SW1 and SW2 are in a conducting state and shift to frequencies higher than the respective resonant frequencies of the parallel-arm resonators p1 and p2 when the switching elements SW1 and SW2 are in a non-conducting state.

The frequency-tuning range of each of the attenuation pole and pass band of the filter device 1 are dependent on the constant of each of the capacitors C1 and C2. For example, the frequency-tuning range increases as the constant (capacitance value) of each of the capacitors C1 and C2 decreases. Accordingly, the constant of each of the capacitors C1 and C2 may be determined as appropriate in accordance with frequency specifications required for the filter device 1. The filter device 1 thus allows the attenuation pole on the lower side of the pass band to shift higher in frequency in response to switching of the switching elements SW1 and SW2 from conduction to non-conduction. That is, with the filter device 1, the attenuation pole on the lower side of the pass band, and the pass band can be shifted in frequency in response to switching of the switching elements SW1 and SW2 between conduction and non-conduction.

Figure 6A:
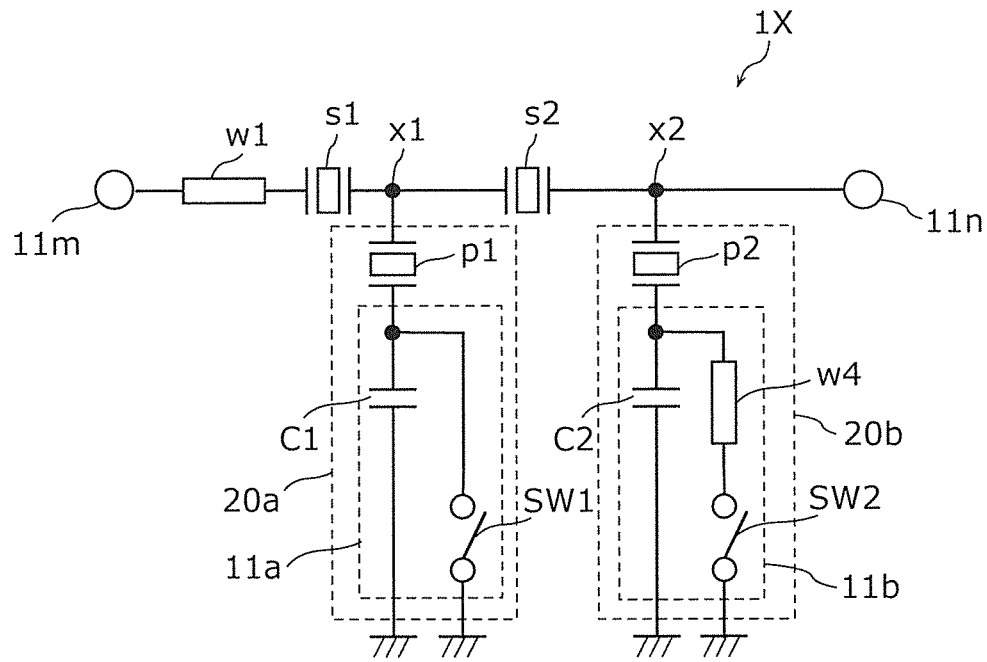
FIG. 6A illustrates the circuit configuration of a filter device according to Embodiment 2.
Figure 6B:
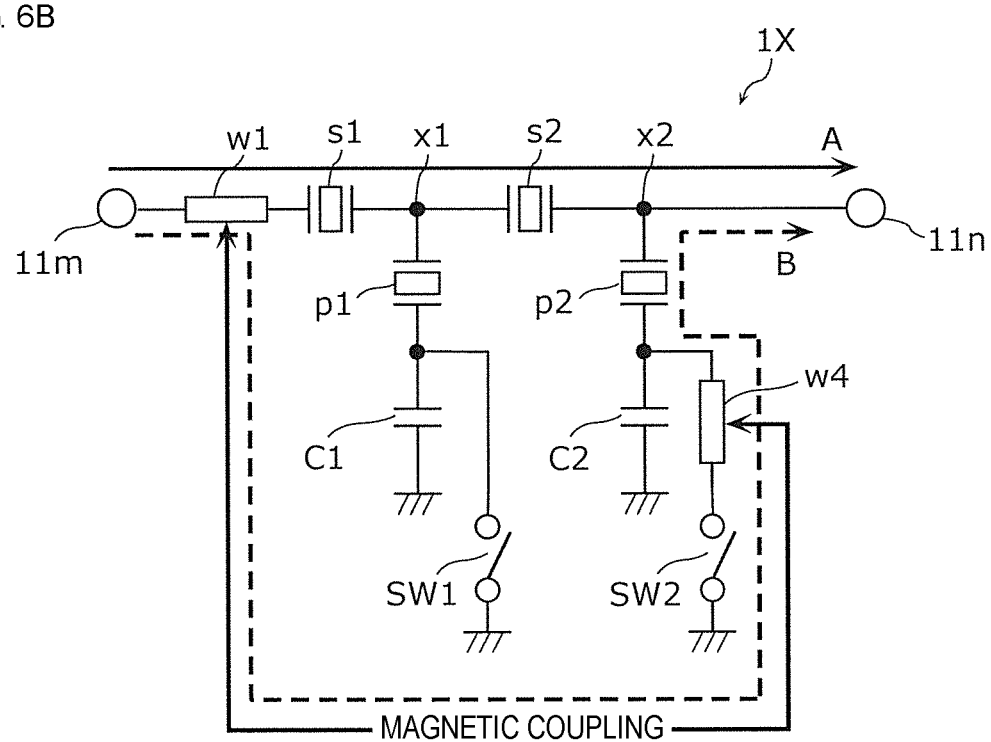
FIG. 6B is an illustration for explaining propagation paths for RF signals in the filter device illustrated in FIG. 6A.

FIG. 6A illustrates the circuit configuration of a filter device 1X according to Embodiment 2, and FIG. 6B is a diagram for explaining propagation paths for RF signals in the circuit illustrated in FIG. 6A. In FIGS. 6A and 6B, transmission lines are also taken into consideration with regard to the configuration of the filter device 1X. FIGS. 6A and 6B explicitly depict only those transmission lines that are necessary for explaining magnetic coupling, and do not depict other transmission lines.

As illustrated in FIG. 6A, in the filter device 1X, the transmission line between the input/output terminal 11m and the series-arm resonator s1 is defined as transmission line w1, and the transmission line between the parallel-arm resonator p2 and the switching element SW2 is defined as transmission line w4.

In the filter device 1X according to Embodiment 2, the input/output terminal 11m corresponds to a first input/output terminal. The input/output terminal 11n corresponds to a second input/output terminal. The series-arm resonator s2 corresponds to a first series-arm resonant circuit having a first series-arm resonator. The node x2 corresponds to a first node. The parallel-arm resonant circuit 20b corresponds to a first parallel-arm resonant circuit. The parallel-arm resonator p2 corresponds to a first parallel-arm resonator, and the capacitor C2 corresponds to a first impedance element. The switching element SW2 corresponds to a first switching element. The transmission line w1 corresponds to a first transmission line. The transmission line w4 corresponds to a second transmission line that is connected to each of the parallel-arm resonator p2 and the switching element SW2.

As the transmission line w1 and the transmission line w4 are magnetically coupled, a path that goes through the magnetically coupled transmission lines w1 and w4 is created between the input/output terminal 11m and the input/output terminal 11n. That is, in the filter device 1X, the following paths are created as propagation paths for RF signals as illustrated in FIG. 6B: Path A that passes through the path connecting the input/output terminal 11m with the input/output terminal 11n; and Path B that passes through the input/output terminal 11n from the input/output terminal 11m via the transmission line w1 and the transmission line w4 due to the above-mentioned magnetic coupling.

That is, magnetic coupling occurs between the following transmission lines: the transmission line w1 located on the path that connects the series-arm resonator s2 with the input/output terminal 11m; and the transmission line w4 connected between the parallel-arm resonator p2 and the switching element SW2 in the parallel-arm resonant circuit 20b connected to ground and to the node x2, which is located on the path connecting the input/output terminal 11n with the series-arm resonator s2.

[2-2. Filtering Characteristics of Filter During Non-Conduction of Switching Element]

The filtering characteristics of the filter device 1X illustrated in FIG. 6B will be described below. The following describes the phase characteristics and bandpass characteristics when the switching elements SW1 and SW2 are in a non-conducting state.

Figure 7:
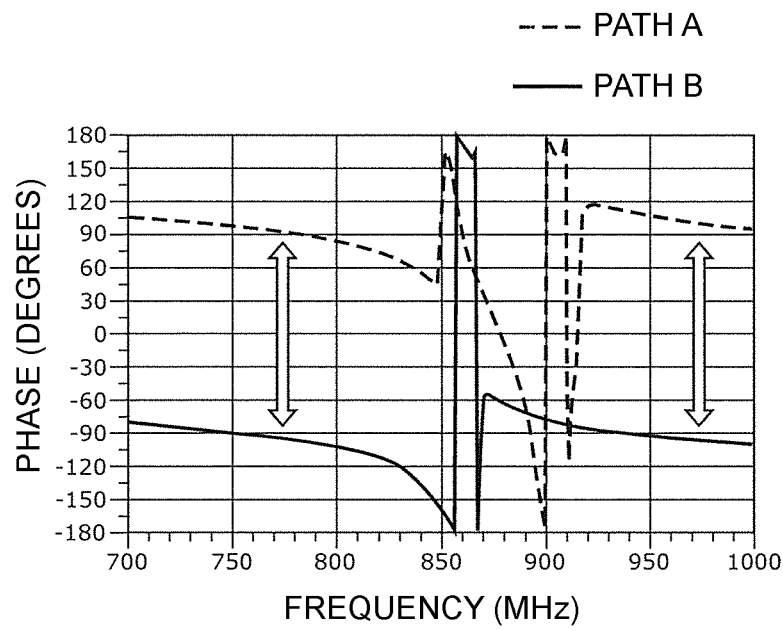
FIG. 7 is a graph illustrating the respective phase characteristics of the propagation paths illustrated in FIG. 3B during non-conduction of a switching element in a filter device according to Embodiment 2.

FIG. 7 is a graph illustrating the phase characteristics of the filter device 1X according to Embodiment 2 when the switching elements SW1 and SW2 are in a non-conducting state. In FIG. 7, the dashed line represents the characteristics for Path A mentioned above, and the solid line represents the characteristics for Path B.

As illustrated in FIG. 7, at the frequency of 836 MHz that lies within the stop band on the lower side of the pass band of the filter device 1X, the first signal that propagates along Path A has a phase of 60°, and the second signal that propagates along Path B has a phase of −120°. Hence, it can be said that in the filter device 1X, the first signal and the second signal are different in phase by substantially 180°, that is, opposite in phase. Likewise, at the frequency of 948 MHz that lies within the stop band on the higher side of the pass band of the filter device 1X, the first signal that propagates along Path A has a phase of 100°, and the second signal that propagates along Path B has a phase of −90°. Hence, it can be said that in the filter device 1X, the first signal and the second signal are different in phase by substantially 180°, that is, opposite in phase.

Figure 8:
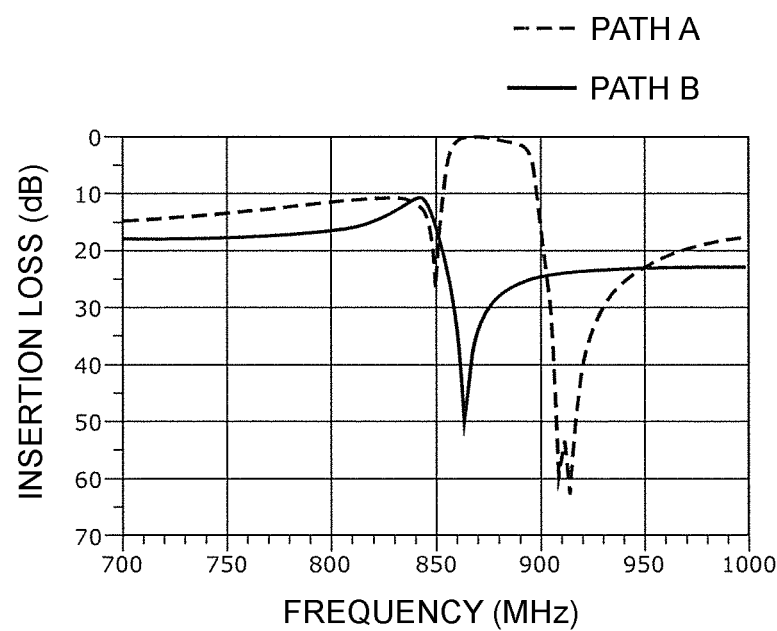
FIG. 8 is a graph illustrating the respective bandpass characteristics of the propagation paths illustrated in FIG. 3B during conduction of a switching element in a filter device according to Embodiment 2.

FIG. 8 is a graph illustrating the bandpass characteristics of the filter device 1X according to Embodiment 2 when the switching elements SW1 and SW2 are in a non-conducting state. In FIG. 8, the dashed line represents the characteristics for Path A mentioned above, and the solid line represents the characteristics for Path B.

As illustrated in FIG. 8, at the frequency of 836 MHz located outside and below the pass band of the filter device 1X, the first signal has an amplitude of −12 dB, and the second signal has an amplitude of −12 dB. At the frequency of 948 MHz located outside and above the pass band of the filter device 1X, the first signal has an amplitude of −23 dB, and the second signal has an amplitude of −23 dB. It can be thus said that in the filter device 1X, the first signal and the second signal are substantially equal in amplitude.

Consequently, the first signal that propagates along Path A, and the second signal that propagates along Path B cancel each other out at each of the above-mentioned frequencies (836 MHz and 948 MHz), thus creating an attenuation pole. This helps improve attenuation outside the pass band.

Figure 9A:
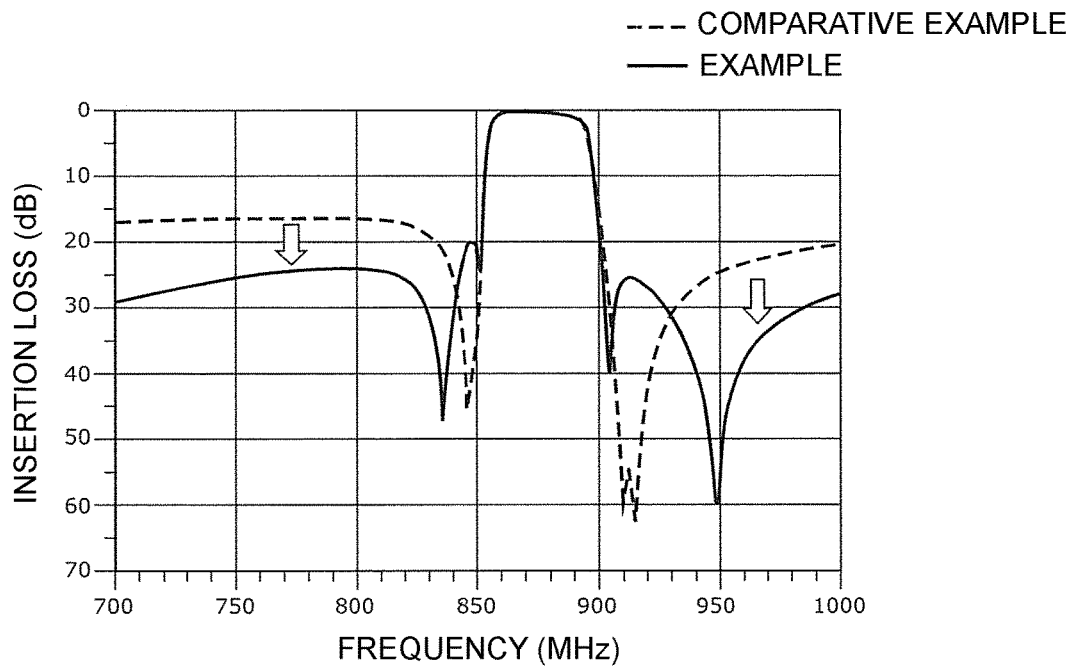
FIG. 9A is a graph illustrating the bandpass characteristics of a filter device according to Embodiment 2 during non-conduction of a switching element.

FIG. 9A is a graph illustrating the bandpass characteristics of the filter device 1X according to Embodiment 2 when the switching elements SW1 and SW2 are in a non-conducting state. In FIG. 9A, the solid line represents the insertion loss of the filter device 1X when the switching elements SW1 and SW2 are in a non-conducting state and magnetic coupling is present between the transmission line w1 and the transmission line w4 (indicated as "Example" in FIG. 9A), and the dashed line represents the insertion loss of the filter device 1X when the switching elements SW1 and SW2 are in a non-conducting state and no such magnetic coupling is present (indicated as "Comparative Example" in FIG. 9A).

As illustrated in FIG. 9A, in comparison with Comparative Example, with Example, improved attenuation as well as extended stop band width are provided due to the attenuation pole (836 MHz) on the lower frequency side of the pass band of the filter device 1X and the attenuation pole (948 MHz) on the higher frequency side of the pass band. That is, improved attenuation is provided when magnetic coupling is present between the transmission line w1 and the transmission line w4 in comparison with when no such magnetic coupling is present.

[2-3. Filtering Characteristics of Filter Device During Conduction of Switching Element]

The following describes, with regard to the filtering characteristics of the filter device 1X illustrated in FIG. 6B, the bandpass characteristics when the switching elements SW1 and SW2 are in a conducting state.

Figure 9B:
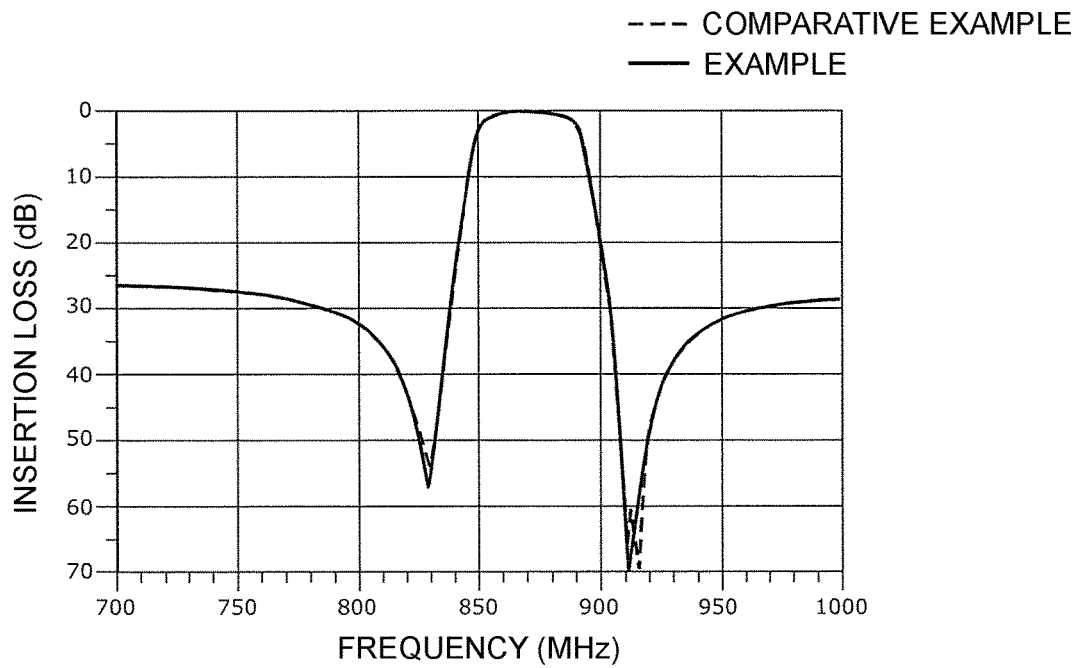
FIG. 9B is a graph illustrating the bandpass characteristics of a filter device according to Embodiment 2 during conduction of a switching element.

FIG. 9B is a graph illustrating the bandpass characteristics of the filter device 1X according to Embodiment 2 when the switching elements SW1 and SW2 are in a conducting state. In FIG. 9B, the solid line represents the insertion loss of the filter device 1X upon switching the switching elements SW1 and SW2 into conduction for a case in which each switching element SW is in a non-conducting state and magnetic coupling is present between the transmission line w1 and the transmission line w4 (indicated as "Example" in FIG. 9B), and the dashed line represents the insertion loss of the filter device 1X upon switching the switching elements SW1 and SW2 into conduction for a case in which each switching element SW is in a non-conducting state and no such magnetic coupling is present (indicated as "Comparative Example" in FIG. 9B).

The change in attenuation observed when the switching elements SW1 and SW2 are placed in a conducting state is not as great as that observed when the switching elements SW1 and SW2 are placed in a non-conducting state.

[2-4. Advantages Etc.]

As described above, with the filter device 1X according to Embodiment 2, the attenuation pole on the lower side of the pass band can be shifted in frequency in response to switching of the switching elements SW1 and SW2 between conduction and non-conduction. This makes it possible to provide a tunable filter whose pass band can be shifted. Further, the magnetic coupling between the transmission line w1 and the transmission line w4 improves the attenuation characteristics exhibited when the switching elements SW1 and SW2 are in a non-conducting state but does not affect the attenuation characteristics exhibited when the switching elements SW1 and SW2 are in a conducing state. This makes it possible to improve the attenuation provided when the switching elements SW1 and SW2 are in a non-conducting state.

In the case of constructing a multi-stage ladder filter, by adding a series-arm resonator and a parallel-arm resonant circuit between the transmission line w1 and the series-arm resonator s2, the attenuation pole created due to the magnetic coupling between the first transmission line and the second transmission line can be moved closer to the pass band. This configuration allows for further improvement in attenuation characteristics due to magnetic coupling, in comparison with when a multi-stage ladder filter is constructed by adding a series-arm resonator and a parallel-arm resonant circuit between the input/output terminal 11m and the transmission line w1 or between the node x2 and the input/output terminal 11n.

The configuration of the filter device 1X is not limited to the above-mentioned configuration but may be altered. For example, the filter device 1X may be a multi-stage ladder filter with two or more parallel-arm resonant circuits and two or more series-arm resonant circuits. Although the capacitor C2 is used as a first impedance element in Embodiment 2, the first impedance element is not limited to a capacitor. For example, the first impedance element may be an inductor or an acoustic wave resonator.

Modifications of Embodiments 1 and 2 will be described below.

Modification 1 of Embodiments 1 and 2

Next, Modification 1 of Embodiments 1 and 2 will be described.

In Embodiment 1 mentioned above, a parallel circuit of the switching element SW and the capacitor C1 is described as an example of the frequency-tuning circuit 11 (first switching circuit) that serves as a switching circuit. However, the configuration of the switching circuit is not limited to this configuration.

Figure 10A:
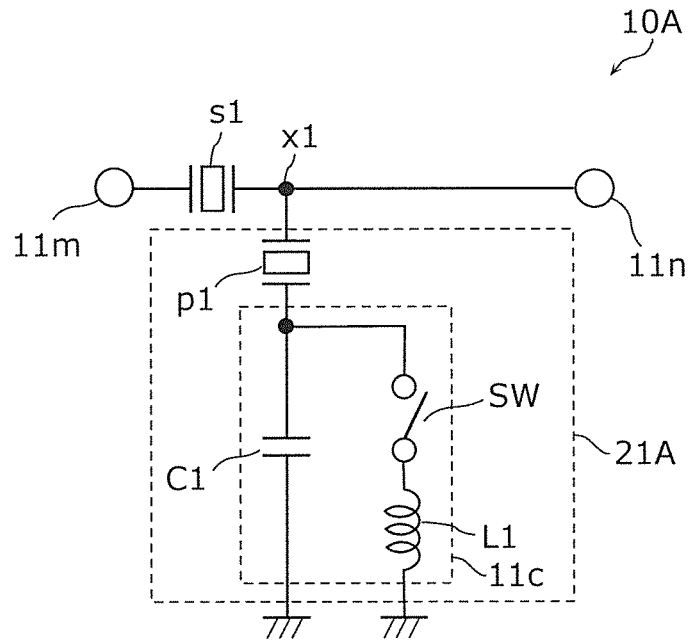
FIG. 10A illustrates the circuit configuration of a filter device according to Modification 1 of Embodiments 1 and 2.

FIG. 10A illustrates the circuit configuration of a filter device 10A according to Modification 1. In the following description made with reference to FIG. 10A, the series-arm resonator s1 and the parallel-arm resonator p1 described above with reference to FIG. 1 will be not described, and only operation of a frequency-tuning circuit 11c will be described.

As compared with the filter device 10 illustrated in FIG. 1, the filter device 10A illustrated in FIG. 10A further includes an inductor L1 connected in series with the switching element SW. That is, in Modification 1, a series circuit of the switching element SW and the inductor L1 is connected in parallel with the capacitor C1 to thereby form the frequency-tuning circuit 11c. The frequency-tuning circuit 11c is connected to the parallel-arm resonator p1 to form a parallel-arm resonant circuit 21A. In this Modification 1, the parallel-arm resonant circuit 21A corresponds to a first parallel-arm resonant circuit. The frequency-tuning circuit 11c corresponds to a first switching circuit.

The order in which the switching element SW and the inductor L1 are connected is not particularly limited. This order of connection may be opposite to the order illustrated in FIG. 10A.

Figure 10B:
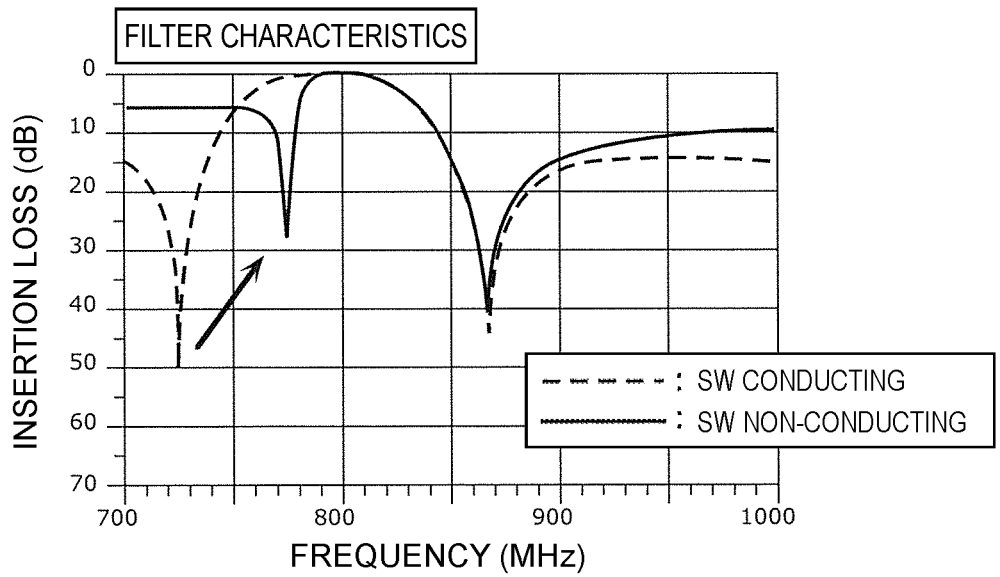
FIG. 10B is a graph illustrating the bandpass characteristics of a filter device according to Modification 1 of Embodiments 1 and 2.

FIG. 10B is a graph illustrating the bandpass characteristics of the filter device 10A according to Modification 1. Specifically, the graph of FIG. 10B compares the bandpass characteristics during conduction and non-conduction of the switching element SW. In FIG. 10B, the dashed line represents the characteristics when the switching element SW is placed in a conducting state, and the solid line represents the characteristics when the switching element SW is placed in a non-conducting state.

The pass band of the filter device 10A is created by placing the anti-resonant frequency of the parallel-arm resonant circuit 21A and the resonant frequency of the series-arm resonator s1 in close proximity to each other.

In this case, according to Modification 1, when the switching element SW is placed in a conducing state, the inductor L1 functions with respect to the parallel-arm resonator p1, and the resulting frequency-tuning circuit 11c is made up of a parallel connection of the capacitor C1 and the inductor L1, and when the switching element SW is placed in a non-conducing state, the capacitor C1 functions with respect to the parallel-arm resonator p1, and the resulting frequency-tuning circuit 11c is made up solely of the capacitor C1. Consequently, when the switching element SW is placed in a conducting state, the resonant frequency of the parallel-arm resonant circuit 21A to a frequency that is lower than the resonant frequency of the parallel-arm resonator p1 alone, and when the switching element SW is placed in a non-conducting state, the resonant frequency of the parallel-arm resonant circuit 21A shifts to a frequency that is higher than the resonant frequency of the parallel-arm resonator p1 alone. Therefore, as illustrated in FIG. 10B, the filter device 10A according to Modification 1 makes it possible to extend the frequency-tuning range of each of the pass band and the attenuation pole in comparison with the filter device 10 according to Embodiment 1.

In this regard, the frequency-tuning range of the pass band of the filter device 10A is dependent on the constant of the capacitor C1 and the constant of the inductor L1. For example, the frequency-tuning range increases as the constant of the inductor L1 increases. Accordingly, the constant of the inductor L1 may be determined as appropriate in accordance with frequency specifications required for the filter device 10A. The inductor L1 may be a variable inductor employing micro electro mechanical systems (MEMS). This allows for fine adjustment of frequency-tuning range.

The relative placement of the capacitor C1 and the inductor L1 described above may be reversed. That is, a series circuit of the switching element SW and the capacitor C1 may be connected in parallel with the inductor L1. With this configuration, the direction in which the attenuation pole shifts upon rendering the switching element SW conducing/non-conducting is opposite to that in the filter device 10A according to Modification 1.

Modification 2 of Embodiments 1 and 2

Next, Modification 2 of Embodiments 1 and 2 will be described.

In the filter device 10 according to Embodiment 1, a single parallel-arm resonator p1 is disposed between the node x1 and ground. However, another parallel-arm resonator different from the parallel-arm resonator p1 may be disposed between the node x1 and ground.

Figure 11A:
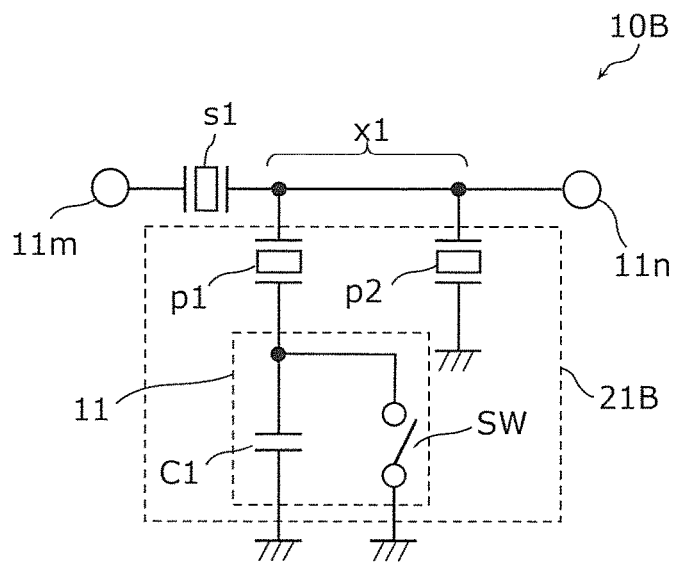
FIG. 11A illustrates the circuit configuration of a filter device according to Modification 2 of Embodiments 1 and 2.

FIG. 11A illustrates the circuit configuration of a filter device 10B according to Modification 2. In the following description made with reference to FIG. 11A, the series-arm resonator s1 and the parallel-arm resonator p1 described above with reference to FIG. 1 will be not described, and only operation of the frequency-tuning circuit 11 will be described.

The filter device 10B illustrated in FIG. 11A includes a parallel-arm resonant circuit 21B, instead of the parallel-arm resonant circuit 21 provided in the filter device 10 illustrated in FIG. 1. In Modification 2, the parallel-arm resonant circuit 21B corresponds to a first parallel-arm resonant circuit.

As compared with the parallel-arm resonant circuit 21, the parallel-arm resonant circuit 21B further includes a parallel-arm resonator p2. The parallel-arm resonator p2 is connected between the node x1 and ground, in parallel with the series circuit of the parallel-arm resonator p1 and the frequency-tuning circuit 11. The parallel-arm resonator p2 differs from the parallel-arm resonator p1 in resonant frequency and anti-resonant frequency. That is, the parallel-arm resonator p1 and the parallel-arm resonator p2 are each connected to a single node x1 located on the series arm that connects the input/output terminal 11m with the input/output terminal 11n. In Modification 2, the parallel-arm resonator p1 corresponds to a first parallel-arm resonator.

With the filter device 10B configured as described above, at least one of the attenuation pole on the lower side of the pass band and the attenuation pole on the higher side of the pass band can be shifted in frequency. The term "single node" as used herein refers to not only a single point on a transmission line but also includes two different points located on a single transmission line with no resonator or impedance element interposed between the two points.

That is, the parallel-arm resonator p2 has a higher resonant frequency than the parallel-arm resonator p1. Further, the parallel-arm resonator p2 has a higher anti-resonant frequency than the parallel-arm resonator p1. The frequency-tuning circuit 11 is connected in series with only the parallel-arm resonator p1 of the two parallel-arm resonators p1 and p2. That is, the parallel-arm resonator p2 is connected in parallel with the series circuit of the parallel-arm resonator p1 and the frequency-tuning circuit 11.

The impedance of the parallel-arm resonant circuit 21B configured as described above has a local minimum at each of the resonant frequencies of the parallel-arm resonators p1 and p2. That is, the parallel-arm resonant circuit 21B has two resonant frequencies. The impedance of the parallel-arm resonant circuit 21B has a local maximum in the range of frequencies between the two resonant frequencies and in the range of frequencies above the two resonant frequencies. That is, the parallel-arm resonant circuit 21B has two anti-resonant frequencies.

Figure 11B:
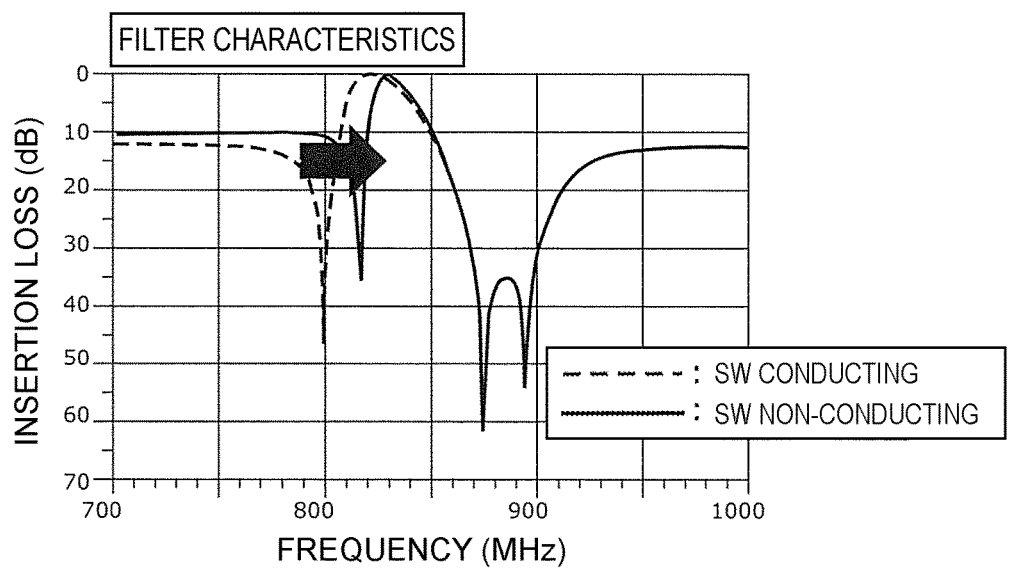
FIG. 11B is a graph illustrating the bandpass characteristics of a filter device according to Modification 2 of Embodiments 1 and 2.

FIG. 11B is a graph illustrating the bandpass characteristics of the filter device 10B according to Modification 2. Specifically, the graph of FIG. 11B compares the bandpass characteristics during conduction and non-conduction of the switching element SW. In FIG. 11B, the dashed line represents the characteristics when the switching element SW is placed in a conducting state, and the solid line represents the characteristics when the switching element SW is placed in a non-conducting state.

The pass band of the filter device 10B is created by placing the lower one of the two anti-resonant frequencies of the parallel-arm resonant circuit 21B, and the resonant frequency of the series-arm resonator s1 in close proximity to each other.

In this case, according to Modification 2, the capacitor C1 functions with respect to the parallel-arm resonator p1 only when the switching element SW is placed in a non-conducting state. Consequently, of the two resonant frequencies of the parallel-arm resonant circuit 21B, the lower resonant frequency shifts to a frequency that is higher than the resonant frequency of the parallel-arm resonator p1 alone upon placing the switching element SW in a non-conducting state. Further, when the switching element SW is placed in a non-conducting state, the lower resonant frequency of the parallel-arm resonant circuit 21B shifts higher than when the switching element SW is placed in a conducting state. In this regard, the attenuation pole on the lower side of the pass band of the filter device 10B is defined by the lower resonant frequency of the parallel-arm resonant circuit 21B. The steepness of the attenuation pole on the lower side of the pass band is defined by the difference between the lower resonant frequency of the parallel-arm resonant circuit 21B and the lower anti-resonant frequency of the parallel-arm resonant circuit 21B. Therefore, as illustrated in FIG. 11B, by switching the switching element SW from conduction to non-conduction, the attenuation pole on the lower side of the pass band of the filter device 10B can be shifted higher in frequency, and also the pass band can be shifted higher in frequency without necessarily deteriorating loss at the lower end of the pass band.

Modification 3 of Embodiments 1 and 2

Next, Modification 3 of Embodiments 1 and 2 will be described.

In the filter device 10B according to Modification 2 of the Embodiment 1, the frequency-tuning circuit 11 is connected in series with only the parallel-arm resonator p1 of the two parallel-arm resonators p1 and p2. However, the frequency-tuning circuit 11 may be connected in series with only the parallel-arm resonator p2 of the two parallel-arm resonators p1 and p2.

That is, in Embodiments 1 and 2 and Modification 2, the parallel-arm resonator p1 having a resonant point below the pass band of the filter has been described as an example of a first parallel-arm resonator that is connected to the capacitor C1 with no other acoustic wave resonator interposed therebetween. By contrast, in the following description of Modification 3, the parallel-arm resonator p2 having a resonant point above the pass band of the filter will be described as an example of a first parallel-arm resonator.

Figure 12A:
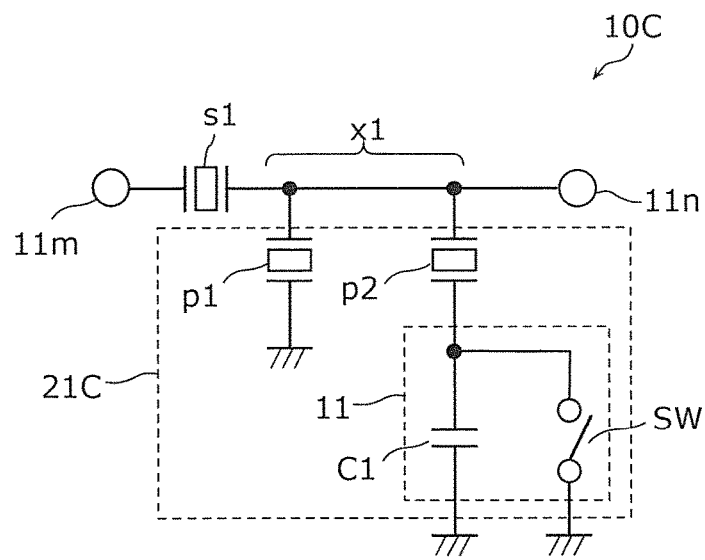
FIG. 12A illustrates the circuit configuration of a filter device according to Modification 3 of Embodiments 1 and 2.

FIG. 12A illustrates the circuit configuration of a filter device 10C according to Modification 3. In the following description made with reference to FIG. 12A, the series-arm resonator s1 and the parallel-arm resonator p1 described above with reference to FIG. 1 will be not described, and only operation of the frequency-tuning circuit 11 will be described.

The filter device 10C in FIG. 12A includes a parallel-arm resonant circuit 21C instead of the parallel-arm resonant circuit 21 of the filter device 10 illustrated in FIG. 1. In the parallel-arm resonant circuit 21C, the frequency-tuning circuit 11 is connected in series with only the parallel-arm resonator p2 of the two parallel-arm resonators p1 and p2. In Modification 3, the parallel-arm resonant circuit 21C corresponds to a first parallel-arm resonant circuit, and the parallel-arm resonator p2 corresponds to a first parallel-arm resonator. The parallel-arm resonator p1 differs from the parallel-arm resonator p2 in resonant frequency and anti-resonant frequency.

That is, in Modification 3, the parallel-arm resonator p2 has a higher resonant frequency than the parallel-arm resonator p1. Further, the parallel-arm resonator p2 has a higher anti-resonant frequency than the parallel-arm resonator p1. The frequency-tuning circuit 11 is connected in series with only the parallel-arm resonator p2 of the two parallel-arm resonators p1 and p2. That is, the parallel-arm resonator p1 is connected in parallel with the series circuit of the parallel-arm resonator p2 and the frequency-tuning circuit 11.

Figure 12B:
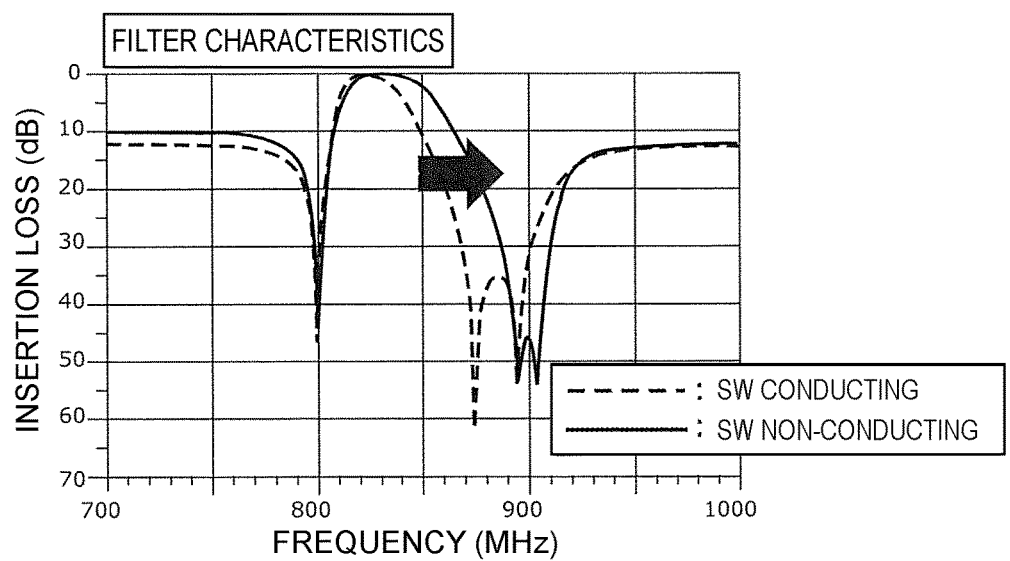
FIG. 12B is a graph illustrating the bandpass characteristics of a filter device according to Modification 3 of Embodiments 1 and 2.

FIG. 12B is a graph illustrating the bandpass characteristics of the filter device 10C according to Modification 3. Specifically, the graph of FIG. 12B compares the bandpass characteristics during conduction and non-conduction of the switching element SW. In FIG. 12B, the dashed line represents the characteristics when the switching element SW is placed in a conducting state, and the solid line represents the characteristics when the switching element SW is placed in a non-conducting state.

As with the filter device 10B, the pass band of the filter device 10C is created by placing the lower one of two anti-resonant frequencies of the parallel-arm resonant circuit 21C, and the resonant frequency of the series-arm resonator s1 in close proximity to each other.

In this case, according to Modification 3, the capacitor C1 functions with respect to the parallel-arm resonator p2 only when the switching element SW is placed in a non-conducting state. Consequently, of the two resonant frequencies of the parallel-arm resonant circuit 21C, the higher resonant frequency shifts to a frequency that is higher than the resonant frequency of the parallel-arm resonator p2 alone upon placing the switching element SW in a non-conducting state. Further, when the switching element SW is placed in a non-conducting state, the lower resonant frequency of the parallel-arm resonant circuit 21C shifts higher than when the switching element SW is placed in a conducting state. In this regard, the attenuation pole on the higher side of the pass band of the filter device 10C is defined by the higher resonant frequency of the parallel-arm resonant circuit 21C. The steepness of the attenuation pole on the higher side of the pass band is defined by the difference between the higher resonant frequency of the parallel-arm resonant circuit 21C and the lower anti-resonant frequency of the parallel-arm resonant circuit 21C. Therefore, as illustrated in FIG. 12B, by switching the switching element SW from conduction to non-conduction, the attenuation pole on the higher side of the pass band of the filter device 10C can be shifted higher in frequency, and also the pass band can be shifted higher in frequency without necessarily deteriorating loss at the higher end of the pass band.

Modification 4 of Embodiments 1 and 2

Next, Modification 4 of Embodiments 1 and 2 will be described.

In Modification 2 of Embodiments 1 and 2 mentioned above, the filter device 10B includes the frequency-tuning circuit 11 connected in series with which only the parallel-arm resonator p1 of the two parallel-arm resonators p1 and p2. In Modification 3 of Embodiments 1 and 2 mentioned above, the filter device 10C includes the frequency-tuning circuit 11 connected in series with only the parallel-arm resonator p2 of the two parallel-arm resonators p1 and p2. However, the filter device may include the frequency-tuning circuit 11 for each of the parallel-arm resonator p1 and the parallel-arm resonator p2.

Figure 13A:
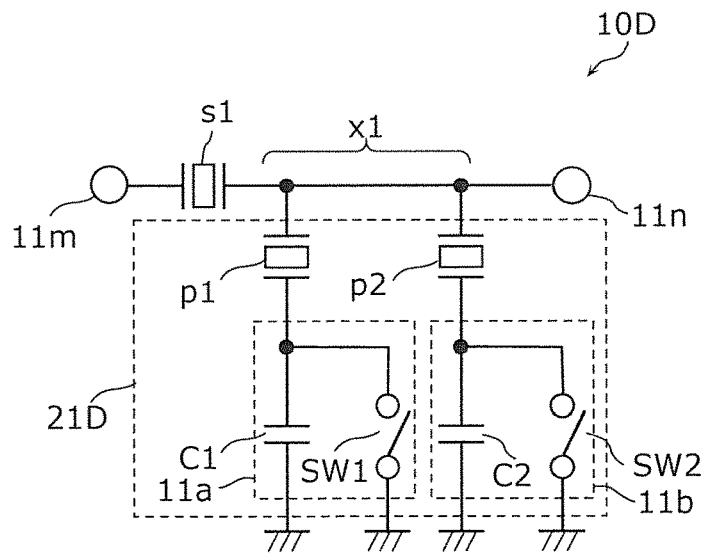
FIG. 13A illustrates the circuit configuration of a filter device according to Modification 4 of Embodiments 1 and 2.

FIG. 13A illustrates the circuit configuration of a filter device 10D according to Modification 4. In the following description made with reference to FIG. 13A, the series-arm resonator s1 and the parallel-arm resonator p1 described above with reference to FIG. 1 will be not described, and only operation of the frequency-tuning circuits 11a and 11b will be described.

The filter device 10D in FIG. 13A includes both the frequency-tuning circuit 11a and the frequency-tuning circuit 11b. The frequency-tuning circuit 11a corresponds to the frequency-tuning circuit 11 of the filter device 10B illustrated in FIG. 11A, and the frequency-tuning circuit 11b corresponds to the frequency-tuning circuit 11 of the filter device 10C illustrated in FIG. 12A. That is, a parallel-arm resonant circuit 21D according to Modification 4 includes the frequency-tuning circuit 11a, which is connected in series with the parallel-arm resonator p1, and the frequency-tuning circuit 11b, which is a frequency-tuning circuit connected in series with the parallel-arm resonator p2 and different from the frequency-tuning circuit 11a. In Modification 4, the parallel-arm resonant circuit 21D corresponds to a first parallel-arm resonant circuit, and the parallel-arm resonator p1 corresponds to a first parallel-arm resonator. The parallel-arm resonator p1 differs from the parallel-arm resonator p2 in resonant frequency and anti-resonant frequency. The frequency-tuning circuit 11a corresponds to a first switching circuit. The frequency-tuning circuit 11b is a switching circuit different from the first switching circuit.

Figure 13B:
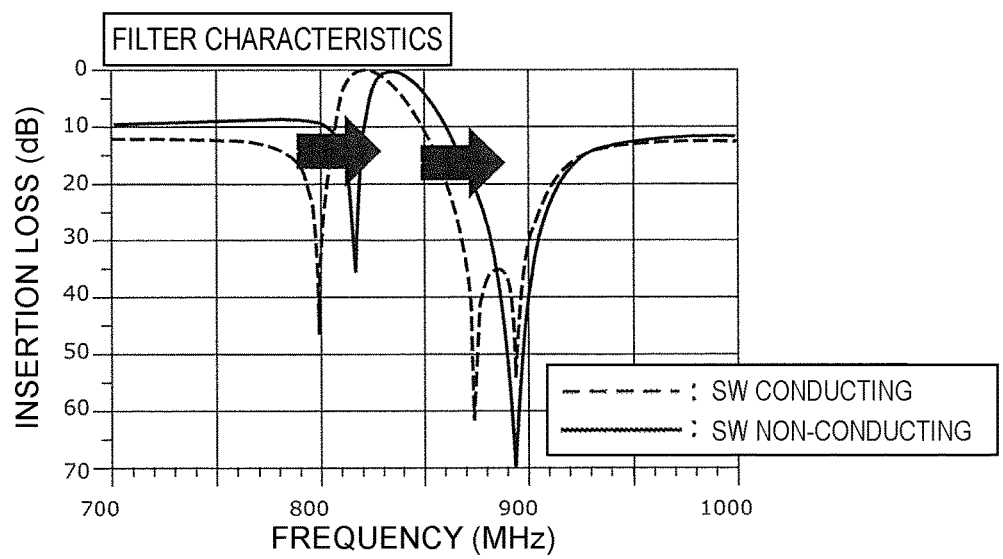
FIG. 13B is a graph illustrating the bandpass characteristics of a filter device according to Modification 4 of Embodiments 1 and 2.

FIG. 13B is a graph illustrating the bandpass characteristics of the filter device 10D according to Modification 4. Specifically, the graph of FIG. 13B compares the bandpass characteristics during conduction and non-conduction of the switching elements SW1 and SW2. In FIG. 13B, the dashed line represents the characteristics when the switching elements SW1 and SW2 are placed in a conducting state, and the solid line represents the characteristics when the switching elements SW1 and SW2 are placed in a non-conducting state.

In Modification 4, the capacitor C1 functions with respect to the parallel-arm resonator p1 only when the switching element SW1 is placed in a non-conducting state. The capacitor C2 functions with respect to the parallel-arm resonator p2 only when the switching element SW2 is placed in a non-conducting state. Consequently, of two resonant frequencies of the parallel-arm resonant circuit 21D, the lower resonant frequency shifts to a frequency that is higher than the resonant frequency of the parallel-arm resonator p1 alone when the switching element SW1 is placed in a non-conducting state. Of the two resonant frequencies of the parallel-arm resonant circuit 21D, the higher resonant frequency shifts to a frequency that is higher than the resonant frequency of the parallel-arm resonator p2 alone when the switching element SW2 is placed in a non-conducting state. Further, when at least one of the switching elements SW1 and SW2 is placed in a non-conducting state, the lower anti-resonant resonant frequency of the parallel-arm resonant circuit 21D shifts higher than when both the switching elements SW1 and SW2 are placed in a conducting state.

Therefore, as illustrated in FIG. 13B, by switching both the switching elements SW1 and SW2 of the filter device 10D from conduction to non-conduction, the attenuation pole on the lower side of the pass band and the attenuation pole on the higher side of the pass band can be shifted higher in frequency, and also the pass band can be shifted higher in frequency without necessarily deteriorating loss at the higher and lower ends of the pass band. Consequently, for example, the center frequency of the filter device 10D can be shifted while maintaining the pass band width.

In the filter device 10D, the switching elements SW1 and SW2 may not be both rendered conducting/non-conducting at the same time. Alternatively, these switching elements may be rendered conducting/non-conducting individually. Rendering the switching elements SW1 and SW2 conducting/non-conducting individually allows for greater variations of pass bands that can be switched by the filter device 10D. Specifically, the frequency at the higher end of the pass band can be varied between when the switching element SW2 connected in series with the parallel-arm resonator p2 is rendered conducting and when the switching element SW2 is rendered non-conducting. Further, the frequency at the lower end of the pass band can be varied between when the switching element SW1 connected in series with the parallel-arm resonator p1 is rendered conducting and when the switching element SW1 is rendered non-conducting.

By contrast, rendering the switching elements SW1 and SW2 conducting/non-conducting at the same time makes it possible to reduce the number of control lines for controlling the switching elements SW1 and SW2. This leads to simplified configuration of the filter device 10D.

Therefore, by rendering both the switching elements SW1 and SW2 conducting makes it possible to reduce the number of control lines for controlling the switching elements SW1 and SW2. This leads to simplified configuration of the filter device 10D or non-conducting, both the lower and higher ends of the pass band can be shifted lower or higher. That is, the center frequency of the pass band can be shifted lower or higher. Further, by switching one of the switching elements SW1 and SW2 from conduction to non-conduction and switching the other from non-conduction to conduction, both the lower and higher ends of the pass band can be shifted in such a way as to increase or decrease the difference in frequency between the two ends of the pass band. That is, the pass band width can be tuned while keeping the center frequency of the pass band substantially constant. Furthermore, by switching one of the switching elements SW1 and SW2 between conduction and non-conduction with the other placed in a conducting or non-conducting state, one of the lower and higher ends of the pass band can be shifted lower or higher while keeping the other fixed. That is, the lower or higher end of the pass band can be tuned in frequency.

As described above, the filter device 10D includes the frequency-tuning circuit 11a connected in series with only the parallel-arm resonator p1 of the two parallel-arm resonators p1 and p2, and the frequency-tuning circuit 11b connected in series with only the parallel-arm resonator p2 of the two parallel-arm resonators p1 and p2. This configuration helps increase the degree of freedom in tuning the pass band.

Modification 5 of Embodiments 1 and 2

Next, Modification 5 of Embodiments 1 and 2 will be described.

In Modification 2 of Embodiments 1 and 2, the frequency-tuning circuit 11 is connected in series with only the parallel-arm resonator p1 of the two parallel-arm resonators p1 and p2. In Modification 3 of Embodiments 1 and 2, the frequency-tuning circuit 11 is connected in series with only the parallel-arm resonator p2 of the two parallel-arm resonators p1 and p2. However, the frequency-tuning circuit 11 may be connected in series with a parallel circuit of the parallel-arm resonator p1 and the parallel-arm resonator p2.

Figure 14A:
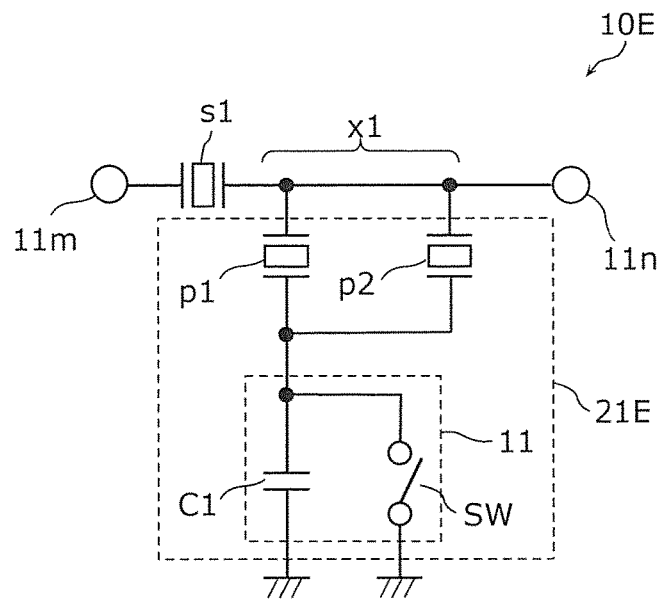
FIG. 14A illustrates the circuit configuration of a filter device according to Modification 5 of Embodiments 1 and 2.

FIG. 14A illustrates the circuit configuration of a filter device 10E according to Modification 5. In the following description made with reference to FIG. 14A, the series-arm resonator s1 and the parallel-arm resonator p1 described above with reference to FIG. 1 will be not described, and only operation of the frequency-tuning circuit 11 will be described.

The filter device 10E in FIG. 14A includes a parallel-arm resonant circuit 21E. The parallel-arm resonant circuit 21E has the frequency-tuning circuit 11 connected in series with a parallel circuit of the parallel-arm resonator p1 and the parallel-arm resonator p2. In Modification 5, the parallel-arm resonant circuit 21E corresponds to a first parallel-arm resonant circuit, and the parallel-arm resonator p1 corresponds to a first parallel-arm resonator. The parallel-arm resonator p2 is a parallel-arm resonator different from the first parallel-arm resonator. The frequency-tuning circuit 11 corresponds to a first switching circuit.

Figure 14B:
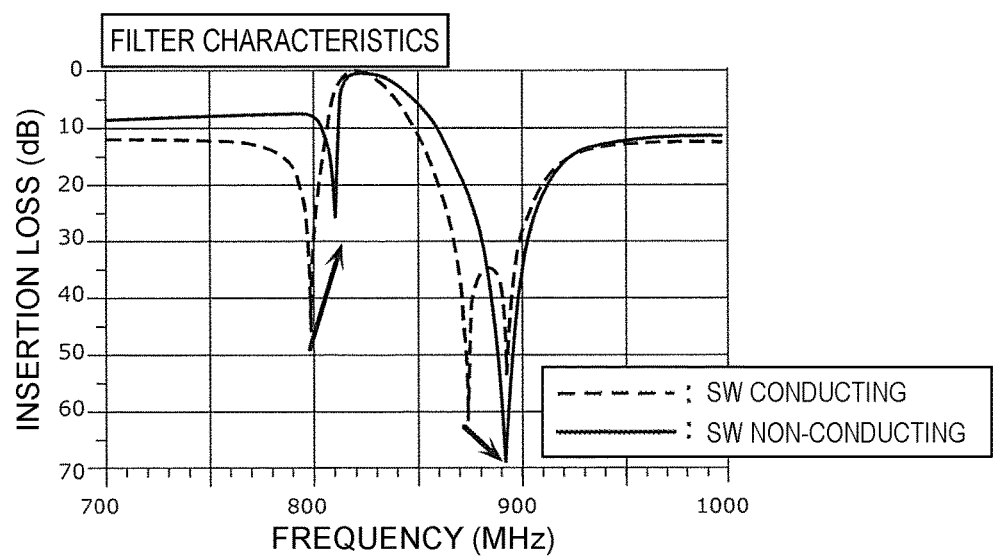
FIG. 14B is a graph illustrating the bandpass characteristics of a filter device according to Modification 5 of Embodiments 1 and 2.

FIG. 14B is a graph illustrating the bandpass characteristics of the filter device 10E according to Modification 5. Specifically, the graph of FIG. 14B compares the bandpass characteristics during conduction and non-conduction of the switching element SW. In FIG. 14B, the dashed line represents the characteristics when the switching element SW is placed in a conducting state, and the solid line represents the characteristics when the switching element SW is placed in a non-conducting state.

As with the filter device 10B, the pass band of the filter device 10E is created by placing the lower one of two anti-resonant frequencies of the parallel-arm resonant circuit 21E, and the resonant frequency of the series-arm resonator s1 in close proximity to each other.

In this case, according to Modification 5, the capacitor C1 functions with respect to both the parallel-arm resonators p1 and p2 only when the switching element SW is placed in a non-conducting state. Consequently, of two resonant frequencies of the parallel-arm resonant circuit 21E, the lower resonant frequency shifts to a frequency that is higher than the resonant frequency of the parallel-arm resonator p1 alone upon placing the switching element SW in a non-conducting state. Further, of the two resonant frequencies of the parallel-arm resonant circuit 21E, the higher resonant frequency shifts to a frequency that is higher than the resonant frequency of the parallel-arm resonator p2 alone upon placing the switching element SW in a non-conducting state. It is to be noted, however, that due to the frequency-tuning circuit 11 being connected in series with the parallel circuit of the parallel-arm resonators p1 and p2, the lower anti-resonant frequency of the parallel-arm resonant circuit 21E does not shift when the switching element SW is placed in a non-conducting state. Therefore, as illustrated in FIG. 14B, the attenuation poles on both sides of the pass band of the filter device 10E can be shifted higher in frequency by switching the switching element SW from conduction to non-conduction.

Modification 6 of Embodiments 1 and 2

Next, Modification 6 of Embodiments 1 and 2 will be described.

Figure 15A:
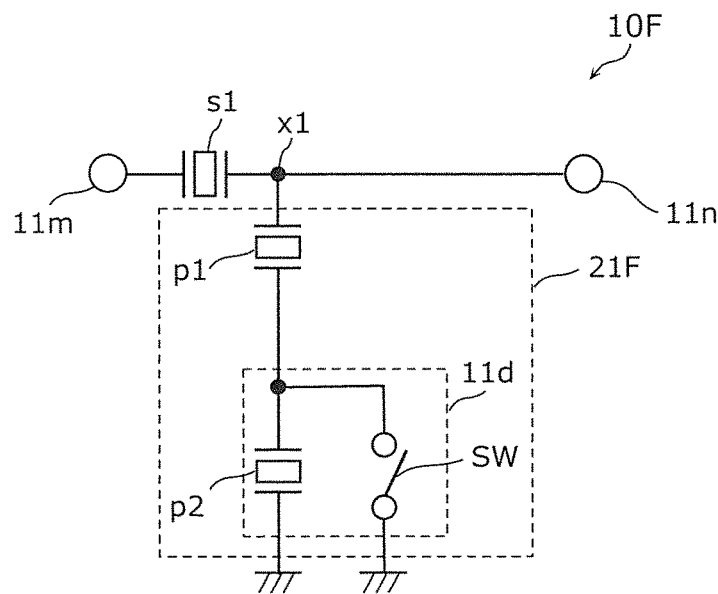
FIG. 15A illustrates the circuit configuration of a filter device according to Modification 6 of Embodiments 1 and 2.

FIG. 15A illustrates the circuit configuration of a filter device 10F according to Modification 6. In the following description made with reference to FIG. 15A, the series-arm resonator s1 and the parallel-arm resonator p1 described above with reference to FIG. 1 will be not described, and only operation of a frequency-tuning circuit 11d will be described.

In Modification 1 of Embodiments 1 and 2 mentioned above, the frequency-tuning circuit 11 is implemented as a parallel circuit of the capacitor C1 and the switching element SW. Alternatively, with the parallel-arm resonator p2 used instead of the capacitor C1, the frequency-tuning circuit 11 may be implemented as a parallel circuit of the parallel-arm resonator p2 and the switching element SW.

As illustrated in FIG. 15A, in a parallel-arm resonant circuit 21F of the filter device 10F according to Modification 6, the parallel-arm resonator p1 and the frequency-tuning circuit 11d are connected in series. The frequency-tuning circuit 11d is made up of a parallel connection of the parallel-arm resonator p2 and the switching element SW. The frequency-tuning circuit 11d corresponds to a first switching circuit, the parallel-arm resonator p1 corresponds to a first parallel-arm resonator, the parallel-arm resonator p2 corresponds to a first impedance element, and the switching element SW corresponds to a first switching element. That is, in the frequency-tuning circuit 11d, the impedance element is formed by the parallel-arm resonator p2. The switching element SW is connected between the node x1, which is connected with the parallel-arm resonators p1 and p2, and ground. The resonant frequency of the parallel-arm resonator p2 is higher than the resonant frequency of the parallel-arm resonator p1, and the anti-resonant frequency of the parallel-arm resonator p2 is higher than the anti-resonant frequency of the parallel-arm resonator p1. The resonant frequency of the parallel-arm resonator p1 is lower than the resonant frequency of the series-arm resonator s1.

Figure 15B:
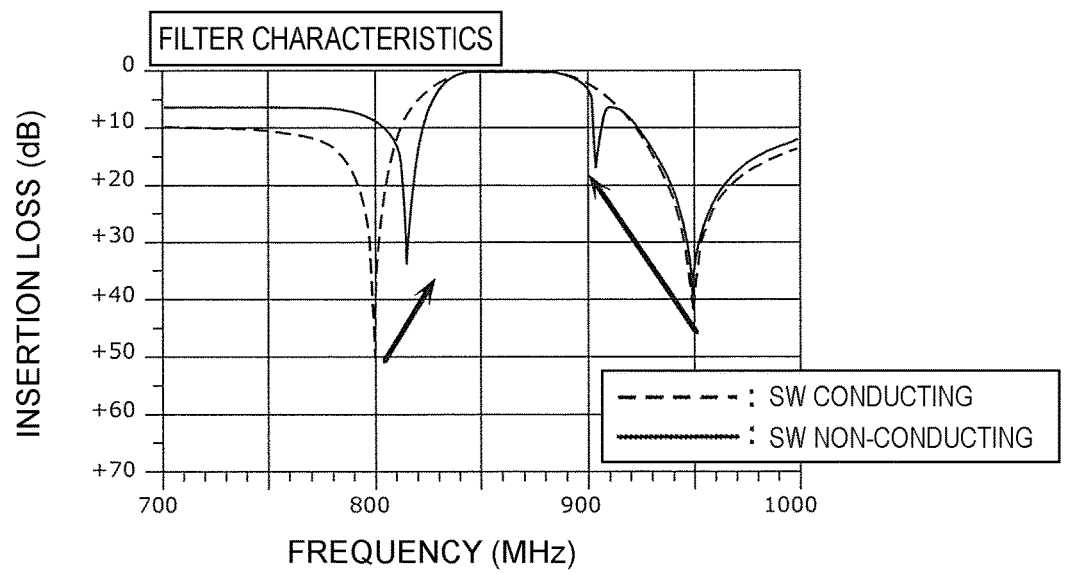
FIG. 15B is a graph illustrating the bandpass characteristics of a filter device according to Modification 6 of Embodiments 1 and 2.

FIG. 15B is a graph illustrating the bandpass characteristics of the filter device 10F according to Modification 6. Specifically, the graph of FIG. 15B compares the bandpass characteristics during conduction and non-conduction of the switching element SW. In FIG. 15B, the dashed line represents the characteristics when the switching element SW is placed in a conducting state, and the solid line represents the characteristics when the switching element SW is placed in a non-conducting state.

By switching the switching element SW from conduction to non-conduction, the attenuation pole on the lower side of the pass band is shifted higher in frequency, and an additional attenuation pole is created on the higher side of the pass band. Therefore, as illustrated in FIG. 15B, the filter device 10F allows its bandpass characteristics to be tuned by switching the switching element SW from conduction to non-conduction.

Embodiment 3

Next, Embodiment 3 will be described with reference to FIG. 16A to 19.

A filter device 1A according to Embodiment 3 differs from the filter device 1X according to Embodiment 2 in the number of transmission lines to be magnetically coupled.

With the configuration of the filter device 1X illustrated in FIG. 6B as an example of the filter device 1 according to Embodiment 2 mentioned above, a magnetic coupling is made between the transmission line w1, which is connected to the input/output terminal 11m, and the transmission line w4, which is connected between the parallel-arm resonator p2 and the switching element SW2. However, the transmission lines to be magnetically coupled, and the number of such magnetic couplings are not limited to those mentioned above.

Figure 16A:
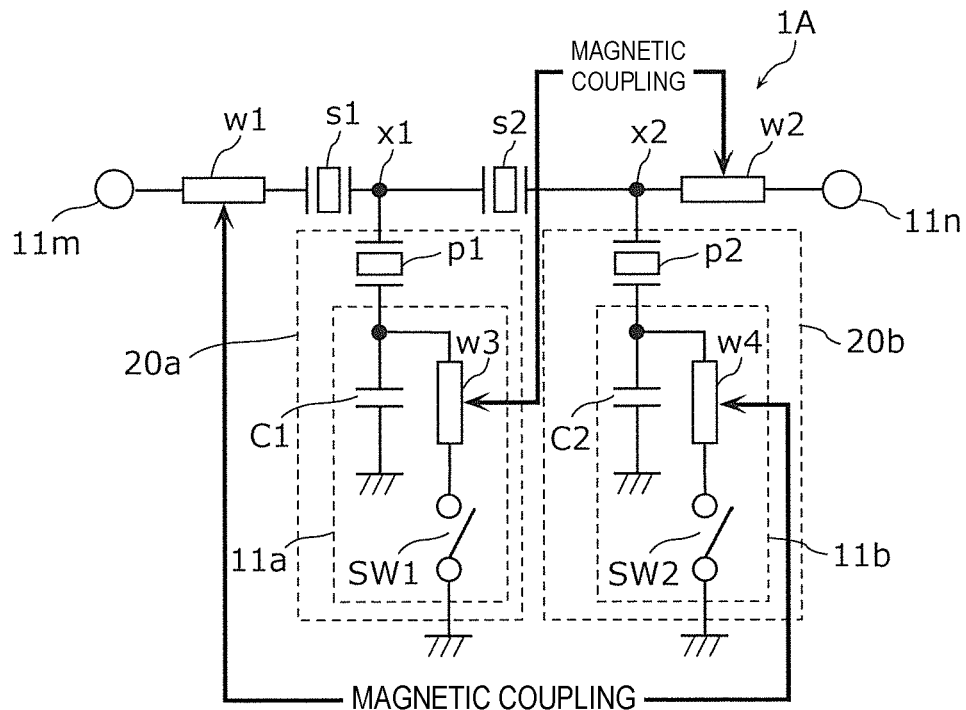
FIG. 16A illustrates an example of magnetic coupling in a filter device according to Embodiment 3.

FIG. 16A illustrates an example of magnetic coupling in the filter device 1A according to Embodiment 3.

The filter device 1A illustrated in FIG. 16A is identical or similar to the filter device 1 according to Embodiment 2 in the configuration of the following components: the parallel-arm resonators p1 and p2, the capacitors C1 and C2, and the switching elements SW1 and SW2. The filter device 1A differs from the filter device 1X illustrated in FIG. 6A only in the transmission lines to be magnetically coupled.

In FIG. 16A, the series-arm resonator s2 corresponds to a first series-arm resonator. A first series-arm resonant circuit is formed by the first series-arm resonator. The parallel-arm resonator p1 corresponds to a second parallel-arm resonator. The parallel-arm resonator p2 corresponds to a first parallel-arm resonator. The parallel-arm resonant circuit 20a corresponds to a second parallel-arm resonant circuit. The parallel-arm resonant circuit 20b corresponds to a first parallel-arm resonant circuit. The frequency-tuning circuit 11a corresponds to a second switching circuit. The frequency-tuning circuit 11b corresponds to a first switching circuit. The capacitor C1 corresponds to a second impedance element. The capacitor C2 corresponds to a first impedance element. The switching element SW1 corresponds to a second switching element. The switching element SW2 corresponds to a first switching element. The node x1 corresponds to a second node. The node x2 corresponds to a first node.

FIG. 16A depicts transmission lines w1, w2, w3, and w4, each of which is a transmission line to be magnetically coupled. The transmission line w1 corresponds to a first transmission line, the transmission line w4 corresponds to a second transmission line, the transmission line w2 corresponds to a fourth transmission line, and the transmission line w3 corresponds to a third transmission line.

In the filter device 1A illustrated in FIG. 16A, the transmission line w1, which is located on the path connecting the first input/output terminal 11m with the second input/output terminal 11n and is connected in series between the input/output terminal 11m and the series-arm resonator s1, is magnetically coupled with the transmission line w4, which is located between the parallel-arm resonator p2 and the switching element SW2. In addition, the transmission line w3, which is located between the parallel-arm resonator p1 and the switching element SW1, is magnetically coupled with the transmission line w2, which is located between the series-arm resonator s2 and the input/output terminal 11n.

Figure 16B:
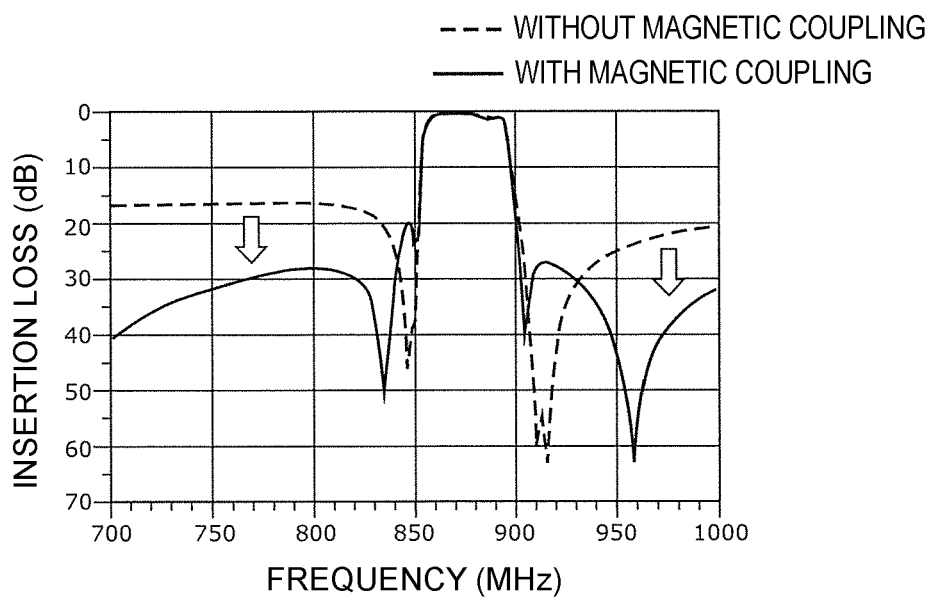
FIG. 16B is a graph illustrating the bandpass characteristics of the filter device illustrated in FIG. 16A during non-conduction of a switching element.

FIG. 16B is a graph illustrating the bandpass characteristics of the filter device 1A illustrated in FIG. 16A when the attenuation pole located on the lower side of the pass band and created by the resonant frequency of the parallel-arm resonant circuit is shifted higher in frequency by placing the switching elements SW1 and SW2 in a non-conducting state. In FIG. 16B, the solid line represents the insertion loss of the filter device 1A in the presence of magnetic coupling between the transmission line w1 and the transmission line w4 and between the transmission line w2 and the transmission line w3 (indicated as "With magnetic coupling" in FIG. 16B), and the dashed line represents the insertion loss of the filter device 1A in the absence of such magnetic coupling (indicated as "Without magnetic coupling" in FIG. 16B).

As illustrated in FIG. 16B, for the case with magnetic coupling, as compared with the case without magnetic coupling, improved attenuation and increased stop band width are provided due to the attenuation pole (834 MHz) on the lower frequency side of the pass band of the filter device 1A and the attenuation pole (958 MHz) on the higher frequency side of the pass band. That is, in the presence of magnetic coupling between the transmission line w1 and the transmission line w4 and the magnetic coupling between the transmission line w2 and the transmission line w3, attenuation can be improved in comparison with the case with no such magnetic coupling.

The bandpass characteristics of the filter device 1A according to Embodiment 3 with the switching elements SW1 and SW2 placed in a conducting state are identical or similar to the bandpass characteristics illustrated in FIG. 9B, and thus will not be described in further detail.

The RF signal that propagates along the path connecting the input/output terminal 11m with the input/output terminal 11n, and the RF signal that propagates along each of the path that goes through the magnetically coupled transmission lines w1 and w4 and the path that goes through the magnetically coupled transmission lines w2 and w3 are opposite in phase and equal in amplitude at some frequencies outside the pass band. Therefore, the RF signal that propagates along the path connecting the input/output terminal 11m with the input/output terminal 11n, and the RF signal that propagates along each of the path that goes through the magnetically coupled transmission lines w1 and w4 and the path that goes through the magnetically coupled transmission lines w2 and w3 are combined at the input/output terminal 11n and thus cancel each other out. This makes it possible to improve signal attenuation outside the pass band.

According to this configuration, due to the magnetic coupling between the transmission line w1 and the transmission line w4 and the magnetic coupling between the transmission line w3 and the transmission line w2, the attenuation characteristics exhibited by the filter device 1A when the switching elements SW1 and SW2 are placed in a non-conducting state can be improved without necessarily affecting the attenuation characteristics exhibited by the filter device 1A when the switching elements SW1 and SW2 are placed in a conducting state.

With the above-mentioned configuration, as compared with the configuration of the filter device 1X illustrated in FIG. 6A, the number of stages in the ladder filter circuit is the same but the number of paths created by magnetic coupling increases. This makes it possible to further improve the attenuation on the lower side of the pass band and on the higher side of the pass band.

The combinations of transmission lines to be magnetically coupled in the filter device 1 are not limited to the above-mentioned combinations, that is, the combination of the transmission lines w1 and w4 and the combination of the transmission lines w2 and w3 but may be other combinations. As compared with the configurations of filter devices 1B and 1C illustrated in FIGS. 17A and 18A described later, the configuration of the filter device 1A illustrated in FIG. 16A provides the greatest improvement in attenuation on the lower side of the pass band and on the higher side of the pass band.

Figure 17A:
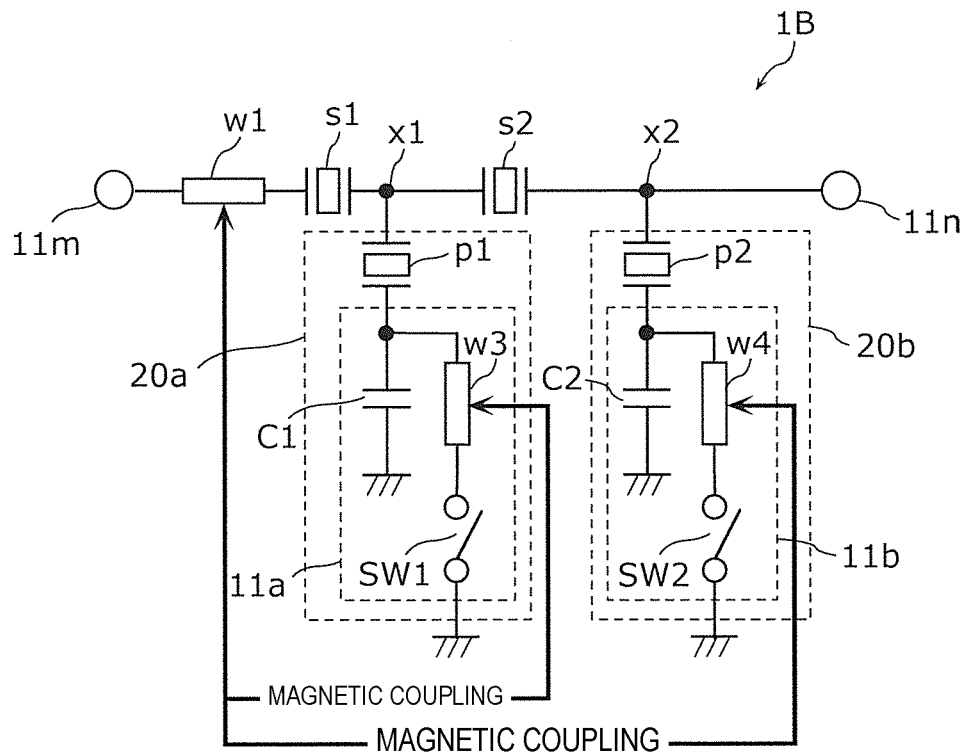
FIG. 17A illustrates another example of magnetic coupling in a filter device according to Embodiment 3.

FIG. 17A illustrates another example of magnetic coupling in a filter device 1B according to Embodiment 3. The filter device 1B illustrated in FIG. 17A is identical or similar to the filter device 1 according to Embodiment 2 in the configuration of the following components: the parallel-arm resonators p1 and p2, the capacitors C1 and C2, and the switching elements SW1 and SW2. The filter device 1B differs from the filter device 1X illustrated in FIG. 6A only in the transmission lines to be magnetically coupled.

In FIG. 17A, the series-arm resonator s1 corresponds to a first series-arm resonator, and also corresponds to a first series-arm resonant circuit having a first series-arm resonator. The series-arm resonator s2 corresponds to a second series-arm resonator. The series-arm resonator s2 also corresponds to a second series-arm resonant circuit having a second series-arm resonator. The parallel-arm resonator p1 corresponds to a first parallel-arm resonator. The parallel-arm resonator p2 corresponds to a second parallel-arm resonator. The parallel-arm resonant circuit 20a corresponds to a first parallel-arm resonant circuit. The parallel-arm resonant circuit 20b corresponds to a second parallel-arm resonant circuit. The frequency-tuning circuit 11a corresponds to a first switching circuit. The frequency-tuning circuit 11b corresponds to a second switching circuit. The capacitor C1 corresponds to a first impedance element. The capacitor C2 corresponds to a second impedance element. The switching element SW1 corresponds to a first switching element. The switching element SW2 corresponds to a second switching element. The node x1 corresponds to a first node. The node x2 corresponds to a second node.

FIG. 17A depicts transmission lines w1, w3, and w4, each of which is a transmission line to be magnetically coupled. The transmission line w1 corresponds to a first transmission line, the transmission line w3 corresponds to a second transmission line, and the transmission line w4 corresponds to a third transmission line.

In the filter device 1B illustrated in FIG. 17A, the transmission line w1, which is located on the path connecting the first input/output terminal 11m with the second input/output terminal 11n and is connected in series between the input/output terminal 11m and the series-arm resonator s1, is magnetically coupled with the transmission line w3, which is located between the parallel-arm resonator p1 and the switching element SW1. In addition, the transmission line w1 connected to the input/output terminal 11m is magnetically coupled with the transmission line w4, which is located between the parallel-arm resonator p2 and the switching element SW2.

Figure 17B:
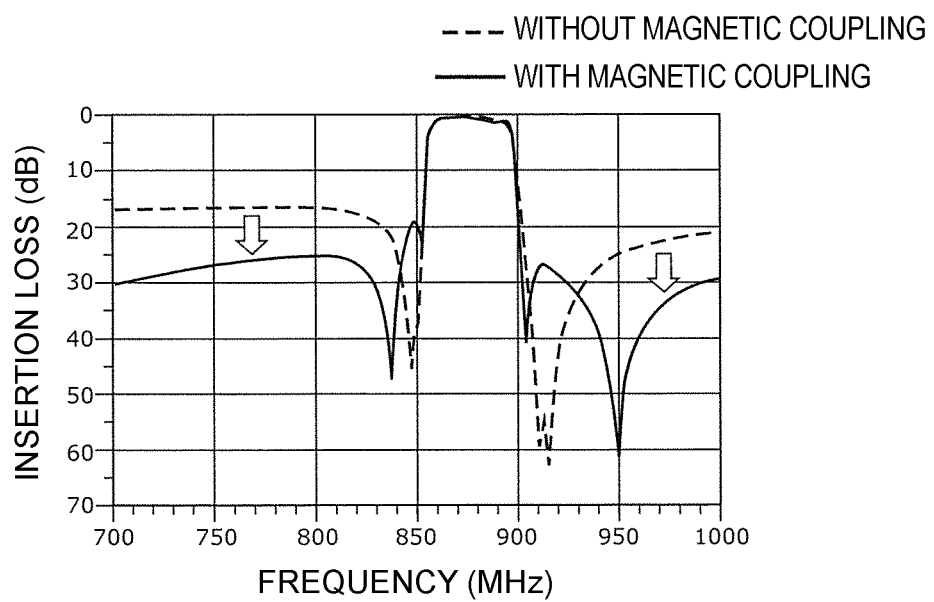
FIG. 17B is a graph illustrating the bandpass characteristics of the filter device illustrated in FIG. 17A during non-conduction of a switching element.

FIG. 17B is a graph illustrating the bandpass characteristics of the filter device 1B illustrated in FIG. 17A when the attenuation pole located on the lower side of the pass band and created by the resonant frequency of the parallel-arm resonant circuit is shifted higher in frequency by placing the switching elements SW1 and SW2 in a non-conducting state. In FIG. 17B, the solid line represents the insertion loss of the filter device 1B in the presence of magnetic coupling between the transmission line w1 and the transmission line w3 and between the transmission line w1 and the transmission line w4 (indicated as "With magnetic coupling" in FIG. 17B), and the dashed line represents the insertion loss of the filter device 1B in the absence of such magnetic coupling (indicated as "Without magnetic coupling" in FIG. 17B).

As illustrated in FIG. 17B, for the case with magnetic coupling, as compared with the case without magnetic coupling, improved attenuation and increased stop band width are provided due to the attenuation pole (836 MHz) on the lower frequency side of the pass band of the filter device 1B and the attenuation pole (948 MHz) on the higher frequency side of the pass band. That is, in the presence of magnetic coupling between the transmission line w1 and the transmission line w3 and the magnetic coupling between the transmission line w1 and the transmission line w4, attenuation can be improved in comparison with the case with no such magnetic coupling.

The bandpass characteristics of the filter device 1B according to Embodiment 3 with the switching elements SW1 and SW2 placed in a conducting state are identical or similar to the bandpass characteristics illustrated in FIG. 9B, and thus will not be described in further detail.

The RF signal that propagates along the path connecting the input/output terminal 11m with the input/output terminal 11n, and the RF signal that propagates along each of the path that goes through the magnetically coupled transmission lines w1 and w4 and the path that goes through the magnetically coupled transmission lines w1 and w3 are opposite in phase and equal in amplitude at some frequencies outside the pass band. Therefore, the RF signal that propagates along the path connecting the input/output terminal 11m with the input/output terminal 11n, and the RF signal that propagates along each of the path that goes through the magnetically coupled transmission lines w1 and w4 and the path that goes through the magnetically coupled transmission lines w1 and w3 are combined at the input/output terminal 11n and thus cancel each other out. This makes it possible to improve signal attenuation outside the pass band.

According to this configuration, due to the magnetic coupling between the transmission line w1 and the transmission line w3 and the magnetic coupling between the transmission line w1 and the transmission line w4, the attenuation characteristics exhibited by the filter device 1B when the switching elements SW1 and SW2 are placed in a non-conducting state can be improved without necessarily affecting the attenuation characteristics exhibited by the filter device 1B when the switching elements SW1 and SW2 are placed in a conducting state.

With the above-mentioned configuration, as compared with the configuration of the filter device 1X illustrated in FIG. 6A, the number of stages in the ladder filter circuit is the same but the number of paths created by magnetic coupling increases. This makes it possible to further improve the attenuation on the lower side of the pass band and on the higher side of the pass band.

The combinations of transmission lines to be magnetically coupled are not limited to the above-mentioned combinations, that is, the combination of the transmission lines w1 and w3 and the combination of the transmission lines w1 and w4 but may be other combinations.

Figure 18A:
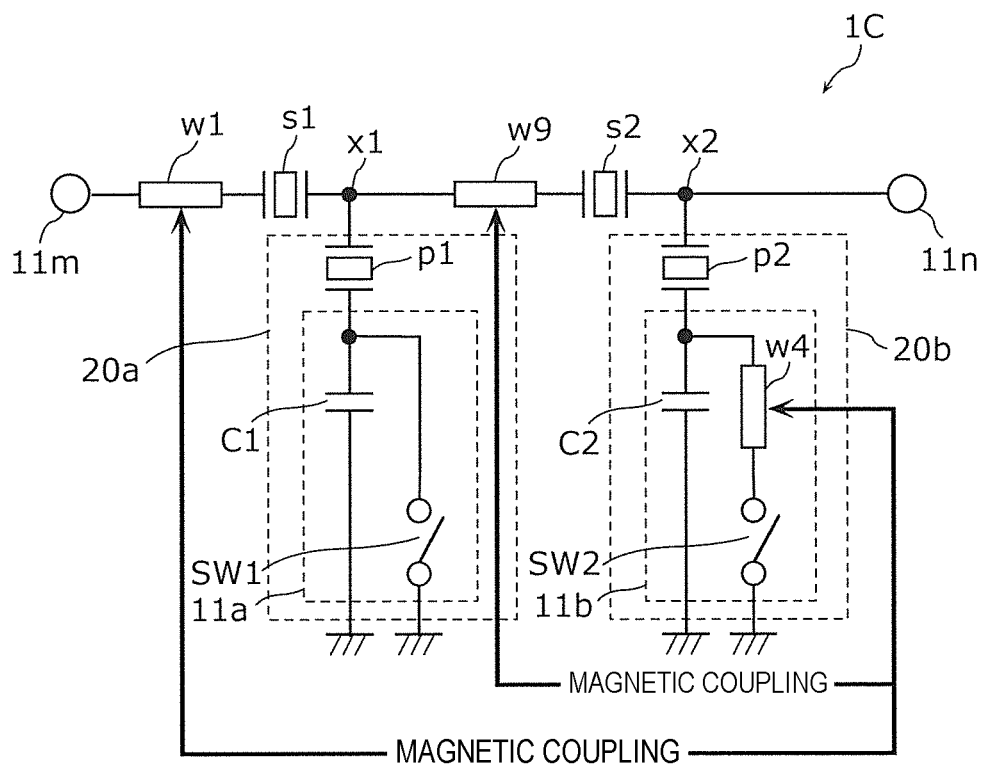
FIG. 18A illustrates another example of magnetic coupling in a filter device according to Embodiment 3.

FIG. 18A illustrates another example of magnetic coupling in a filter device 1C according to Embodiment 3.

The filter device 1C illustrated in FIG. 18A is identical or similar to the filter device 1 according to Embodiment 2 in the configuration of the following components: the parallel-arm resonators p1 and p2, the capacitors C1 and C2, and the switching elements SW1 and SW2. The filter device 1C differs from the filter device 1X illustrated in FIG. 6A only in the transmission lines to be magnetically coupled.

In FIG. 18A, the series-arm resonator s2 corresponds to a first series-arm resonator. A first series-arm resonant circuit is formed by the first series-arm resonator. The parallel-arm resonator p2 corresponds to a first parallel-arm resonator. The parallel-arm resonant circuit 20b corresponds to a first parallel-arm resonant circuit. The frequency-tuning circuit 11b corresponds to a first switching circuit. The capacitor C2 corresponds to a first impedance element. The switching element SW2 corresponds to a first switching element. The node x2 corresponds to a first node. The parallel-arm resonant circuit 20a includes the parallel-arm resonator p1 and the frequency-tuning circuit 11a. The frequency-tuning circuit 11a includes the capacitor C1 and the switching element SW1.

FIG. 18A depicts transmission lines w1, w4, and w9, each of which is a transmission line to be magnetically coupled. The transmission line w1 corresponds to a first transmission line, the transmission line w4 corresponds to a second transmission line, and the transmission line w9 corresponds to a fifth transmission line.

In the filter device 1C, the transmission line w1, which is located on the path connecting the first input/output terminal 11m with the second input/output terminal 11n and is connected in series between the input/output terminal 11m and the series-arm resonator s1, is magnetically coupled with the transmission line w4, which is located between the parallel-arm resonator p2 and the switching element SW2. In addition, the transmission line w9, which is located between the series-arm resonator s1 and the series-arm resonator s2, is magnetically coupled with the transmission line w4, which is located between the parallel-arm resonator p2 and the switching element SW2.

As the transmission line w1 and the transmission line w4 are magnetically coupled, a path that goes through the magnetically coupled transmission lines w1 and w4 from the input/output terminal 11m is created between the input/output terminal 11m and the input/output terminal 11n. As the transmission line w9 and the transmission line w4 are magnetically coupled, a path that goes through the magnetically coupled transmission lines w9 and w4 from the input/output terminal 11m is created between the input/output terminal 11m and the input/output terminal 11n.

That is, in the filter device 1C, the following paths are created as RF propagation paths: a path connecting the input/output terminal 11m with the input/output terminal 11n; a path that goes through the magnetically coupled transmission lines w1 and w4; and a path that goes through the magnetically coupled transmission lines w9 and w4.

Figure 18B:
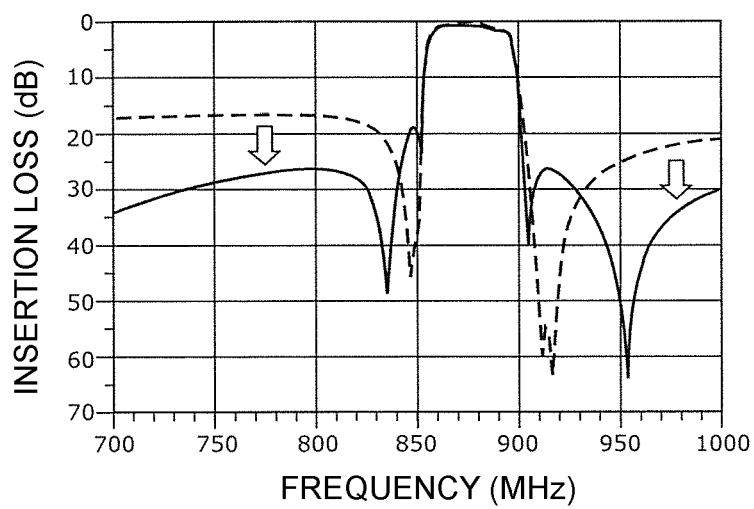
FIG. 18B is a graph illustrating the bandpass characteristics of the filter device illustrated in FIG. 18A during non-conduction of a switching element.

FIG. 18B is a graph illustrating the bandpass characteristics of the filter device 1C according to Embodiment 3 illustrated in FIG. 18A when the attenuation pole located on the lower side of the pass band and created by the resonant frequency of the parallel-arm resonant circuit is shifted higher in frequency by placing the switching elements SW1 and SW2 in a non-conducting state.

In FIG. 18B, the solid line represents the insertion loss of the filter device 1C in the presence of magnetic coupling between the transmission line w1 and the transmission line w4 and between the transmission line w9 and the transmission line w4 (indicated as "With magnetic coupling" in FIG. 18B), and the dashed line represents the insertion loss of the filter device 1C in the absence of such magnetic coupling (indicated as "Without magnetic coupling" in FIG. 18B).

As illustrated in FIG. 18B, for the case with magnetic coupling, as compared with the case without magnetic coupling, improved attenuation and increased stop band width are provided due to the attenuation pole (836 MHz) on the lower frequency side of the pass band of the filter device 1C and the attenuation pole (952 MHz) on the higher frequency side of the pass band. That is, in the presence of magnetic coupling between the transmission line w1 and the transmission line w4 and between the transmission line w9 and the transmission line w4, attenuation can be improved in comparison with the case with no such magnetic coupling.

The bandpass characteristics of the filter device 1C according to Embodiment 3 with the switching elements SW1 and SW2 placed in a conducting state are identical or similar to the bandpass characteristics illustrated in FIG. 9B, and thus will not be described in further detail.

The RF signal that propagates along the path connecting the input/output terminal 11m with the input/output terminal 11n, and the RF signal that propagates along each of the path that goes through the magnetically coupled transmission lines w1 and w4 and the path that goes through the magnetically coupled transmission lines w9 and w4 are opposite in phase and equal in amplitude at some frequencies outside the pass band. Therefore, the RF signal that propagates along the path connecting the input/output terminal 11m with the input/output terminal 11n, and the RF signal that propagates along each of the path that goes through the magnetically coupled transmission lines w1 and w4 and the path that goes through the magnetically coupled transmission lines w9 and w4 are combined at the input/output terminal 11n and thus cancel each other out. This makes it possible to improve signal attenuation outside the pass band.

According to this configuration, due to the magnetic coupling between the transmission line w1 and the transmission line w4 and the magnetic coupling between the transmission line w9 and the transmission line w4, the attenuation characteristics exhibited by the filter device 1C when the switching elements SW1 and SW2 are placed in a non-conducting state can be improved without necessarily affecting the attenuation characteristics exhibited by the filter device 1C when the switching elements SW1 and SW2 are placed in a conducting state.

With the above-mentioned configuration, as compared with the configuration of the filter device 1X illustrated in FIG. 6A, the number of stages in the ladder filter circuit is the same but the number of paths created by magnetic coupling increases. This makes it possible to further improve the attenuation on the lower side of the pass band and on the higher side of the pass band.

The combinations of transmission lines to be magnetically coupled are not limited to the above-mentioned combinations, that is, the combination of the transmission lines w1 and w4 and the combination of the transmission lines w9 and w4 but may be other combinations.

Figure 19:
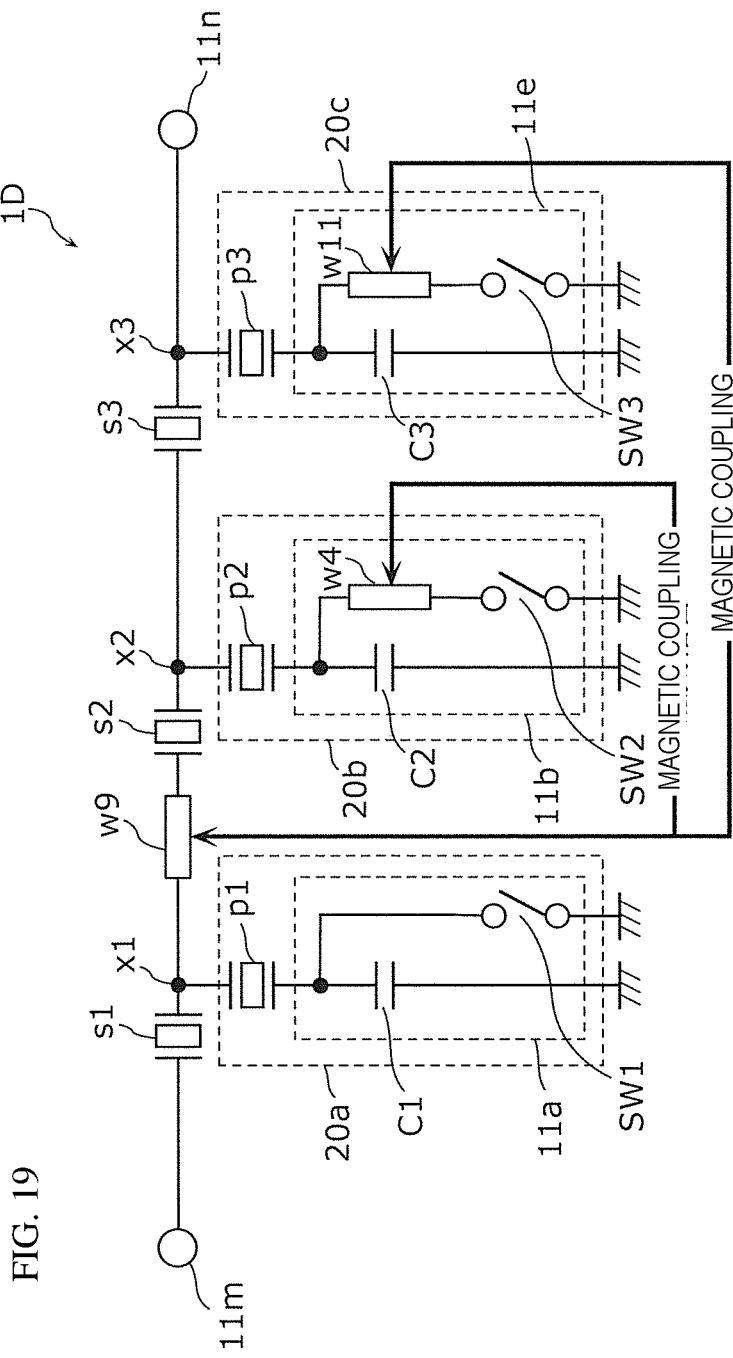
FIG. 19 illustrates another example of magnetic coupling in a filter device according to Embodiment 3.

FIG. 19 illustrates an example of magnetic coupling in a filter device 1D according to Embodiment 3.

The filter device 1D illustrated in FIG. 19 includes series-arm resonators s1, s2, and s3, and parallel-arm resonant circuits 20a, 20b, and 20c. The filter device 1D is identical or similar to the filter device 1 according to Embodiment 2 in the configuration of the following components: the series-arm resonators s1 and s2, the parallel-arm resonant circuits 20a and 20b, the parallel-arm resonators p1 and p2, the capacitors C1 and C2, and the switching elements SW1 and SW2. The parallel-arm resonant circuit 20c includes a parallel-arm resonator p3, and a frequency-tuning circuit 11e. The frequency-tuning circuit 11e includes a capacitor C3, and a switching element SW3. The frequency-tuning circuits 11a, 11b, and 11e are respectively connected between the parallel-arm resonators p1, p2, and p3 and ground.

As with the series-arm resonators s1 and s2 according to Embodiment 2, the series-arm resonator s3 is an acoustic wave resonator. The series-arm resonators s1, s2, and s3 are connected in this order between the input/output terminal 11m and the input/output terminal 11n as viewed from the input/output terminal 11m.

The parallel-arm resonator p3 is a parallel-arm resonator connected between a node x3 and ground (reference terminal). The node x3 is located on the path connecting the series-arm resonator s3 with the input/output terminal 11n. That is, each of the parallel-arm resonators p1, p2, and p3 is a resonator provided to a parallel arm connecting the corresponding node on the above-mentioned series arm with ground.

The parallel-arm resonator p3 has a resonant frequency below the pass band of the filter device 1D and has an anti-resonant frequency within the pass band. In Embodiment 3, the resonant frequency of the parallel-arm resonator p3 is lower than the resonant frequency of the series-arm resonator s3, and the anti-resonant frequency of the parallel-arm resonator p3 is lower than the anti-resonant frequency of the series-arm resonator s3. The parallel-arm resonators p1 and p2 are identical or similar to the parallel-arm resonators p1 and p2 described above with reference to Embodiment 2 and thus will not be described in further detail.

In the filter device 1D, the capacitor C3 is connected between the node x3, which is located on the path connecting the series-arm resonator s3 with the input/output terminal 11n, and ground (reference terminal).

In Embodiment 3, the parallel-arm resonator p3 and the capacitor C3 are connected in series. The series connection of the parallel-arm resonator p3 and the capacitor C3 is connected between the node x3, which is located on the path connecting the series-arm resonator s3 with the input/output terminal 11n, and ground. In Embodiment 3, one terminal of the parallel-arm resonator p3 is connected to the node x3, which is located on the path connecting the series-arm resonator s3 with the input/output terminal 11n, and the other terminal of the parallel-arm resonator p3 is connected to one terminal of the capacitor C3. One terminal of the capacitor C3 is connected to the other terminal of the parallel-arm resonator p3, and the other terminal of the capacitor C3 is connected to ground.

The switching element SW3 is a switching element that constitutes the frequency-tuning circuit 11e together with the capacitor C3. The switching element SW3 is identical or similar in configuration to the switching elements SW1 and SW2 described above with reference to Embodiment 2 and thus will not be described in further detail.

The frequency-tuning circuit 11e is connected in series with the parallel-arm resonator p3 between the node x3, which is located on the path connecting the series-arm resonator s3 with the input/output terminal 11n, and ground. The frequency-tuning circuit 11e is located on the path of a parallel arm that connects the node x3, which is located on the path connecting the input/output terminal 11m with the input/output terminal 11n, with ground. The frequency-tuning circuit 11e constitutes the parallel-arm resonant circuit 20c. The filter device 1D has a three-stage ladder filter structure including the series-arm resonators s1, s2, and s3 and the parallel-arm resonant circuits 20a, 20b, and 20c.

That is, the parallel-arm resonant circuits 20a, 20b, and 20c create the pass band of the filter device 1D, together with the series-arm resonators s1, s2, and s3 located on the path that connects the input/output terminal 11m with the input/output terminal 11n.

In the filter device 1D, the series-arm resonator s2 corresponds to a first series-arm resonator. A first series-arm resonant circuit is formed by the first series-arm resonator. The series-arm resonator s3 corresponds to a second series-arm resonator. A second series-arm resonant circuit is formed by the second series-arm resonator. The parallel-arm resonant circuit 20b corresponds to a first parallel-arm resonant circuit. The parallel-arm resonant circuit 20c corresponds to a second parallel-arm resonant circuit. The parallel-arm resonator p2 corresponds to a first parallel-arm resonator. The parallel-arm resonator p3 corresponds to a second parallel-arm resonator. The frequency-tuning circuit 11b corresponds to a first switching circuit. The frequency-tuning circuit 11e corresponds to a second switching circuit. The capacitor C2 corresponds to a first impedance element. The capacitor C3 corresponds to a second impedance element. The switching element SW2 corresponds to a first switching element. The switching element SW3 corresponds to a second switching element. The node x2 corresponds to a first node. The node x3 corresponds to a second node.

FIG. 19 depicts transmission lines w9, w4, and w11, each of which is a transmission line to be magnetically coupled. The transmission line w9 corresponds to a first transmission line, the transmission line w4 corresponds to a second transmission line, and the transmission line w11 corresponds to a third transmission line. That is, in the filter device 1D, the series-arm resonator s1 is connected in series between the input/output terminal 11m and the transmission line w9, which is the first transmission path, and the parallel-arm resonant circuit 20a is connected between the node x1, which is located between the series-arm resonator s1 and the transmission line w9, and ground. As illustrated in FIG. 19, in the filter device 1D, the transmission line w9, which is located between the series-arm resonators s1 and s2 on the path connecting the first input/output terminal 11m with the second input/output terminal 11n, is magnetically coupled with the transmission line w4, which is located between the parallel-arm resonator p2 and the switching element SW2. In addition, the transmission line w9, which is located between the series-arm resonators s1 and s2, is magnetically coupled with the transmission line w11, which is located between the parallel-arm resonator p3 and the switching element SW3.

As the transmission line w9 and the transmission line w4 are magnetically coupled, a path that goes through the magnetically coupled transmission lines w9 and w4 from the input/output terminal 11m is created between the input/output terminal 11m and the input/output terminal 11n. As the transmission line w9 and the transmission line w11 are magnetically coupled, a path that goes through the magnetically coupled transmission lines w9 and w11 from the input/output terminal 11m is created between the input/output terminal 11m and the input/output terminal 11n.

That is, in the filter device 1D, the following paths are created as RF propagation paths: a path connecting the input/output terminal 11m with the input/output terminal 11n; a path that goes through the magnetically coupled transmission lines w9 and w4; and a path that goes through the magnetically coupled transmission lines w9 and w11.

The RF signal that propagates along the path connecting the input/output terminal 11m with the input/output terminal 11n, and the RF signal that propagates along each of the path that goes through the magnetically coupled transmission lines w9 and w4 and the path that goes through the magnetically coupled transmission lines w9 and w11 are opposite in phase and equal in amplitude at some frequencies outside the pass band. Therefore, the RF signal that propagates along the path passing through the series arm connecting the input/output terminal 11m with the input/output terminal 11n, and the RF signal that propagates along each of the path that goes through the magnetically coupled transmission lines w9 and w4 and the path that goes through the magnetically coupled transmission lines w9 and w11 are combined at the input/output terminal 11n and thus cancel each other out. This makes it possible to improve signal attenuation outside the pass band.

The combinations of transmission lines to be magnetically coupled are not limited to the above-mentioned combinations, that is, the combination of the transmission lines w9 and w4 and the combination of the transmission lines w9 and w11 but may be other combinations.

Embodiment 4

Next, Embodiment 4 will be described with reference to FIGS. 20 to 21B.

In Embodiment 4, a specific structure of a filter device will be described. FIG. 20 is a schematic cross-sectional view of a filter device according to Embodiment 4, illustrating an exemplary structure of the filter device. A filter device 30 illustrated in FIG. 20 represents a filter structure corresponding to the circuit configuration according to Embodiment 1 illustrated in FIG. 3A.

Figure 20:
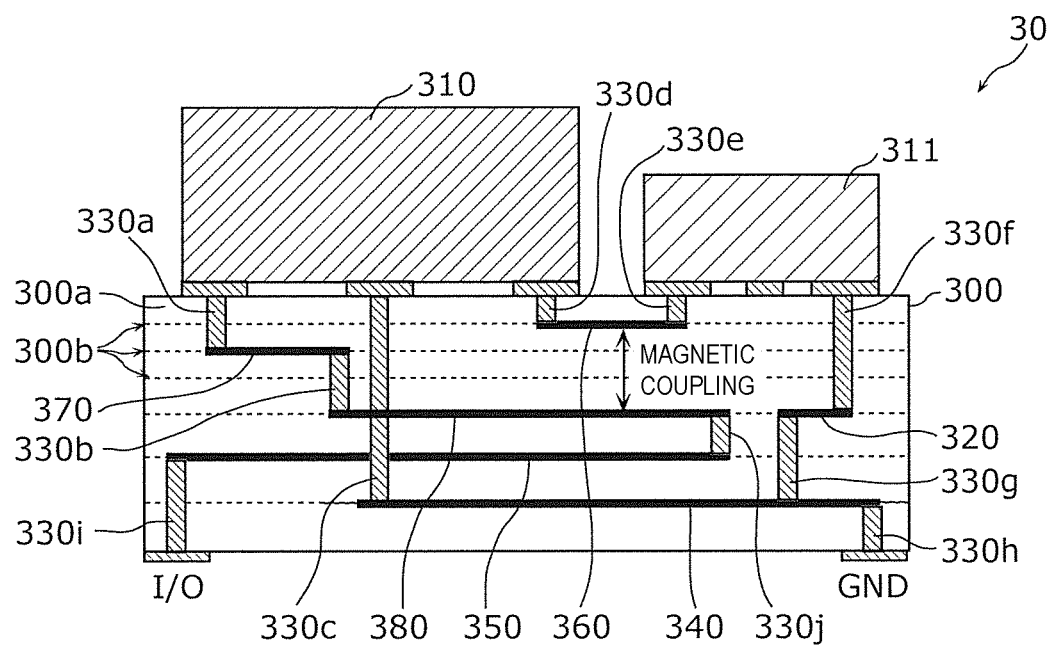
FIG. 20 is a schematic cross-sectional view of a filter device according to Embodiment 4, illustrating an exemplary structure of the filter device.

As illustrated in FIG. 20, the filter device 30 according to Embodiment 4 includes an acoustic wave device 310 and a switching device 311 that are disposed over one side of a substrate 300. The acoustic wave device 310 includes at least one acoustic wave resonator, and an impedance element. The switching device 311 includes a plurality of switching elements. The acoustic wave device 310 includes the series-arm resonator s1, the parallel-arm resonator p1, and the capacitor C1 that are illustrated in FIG. 3A. The switching device 311 corresponds to the switching element SW illustrated in FIG. 3A.

The acoustic wave device 310 and the switching device 311 are each connected to a conductive pattern, a via-hole, or a through-hole provided inside the substrate 300, via a conductive pad provided on the front side of the substrate 300. On the other side of the substrate 300, an I/O terminal and a ground terminal (GND terminal) are each formed by a conductive pad. The I/O terminal and the GND terminal are each connected to at least one of a conductive pattern, a via-hole, or a through-hole provided inside the substrate 300.

The substrate 300 is, for example, a multilayer substrate made up of a plurality of ceramic layers 300a. The substrate 300 is not limited to a ceramic substrate made of a ceramic material but may be a resin substrate made of a material such as polychlorinated biphenyl (PCB).

A plurality of conductive patterns are provided on the front side of the substrate 300 and at each interlayer boundary 300b of the plurality of ceramic layers 300a. The plurality of conductive patterns each constitute a transmission line, and an impedance element such as a capacitor or an inductor. For example, in the filter device 30 illustrated in FIG. 20, a transmission line 320, a ground interconnect line 340, a transmission line 350, a transmission line 360, and a transmission line 370 are formed by the conductive patterns. The substrate 300 is also provided with via-holes or through-holes that penetrate the plurality of ceramic layers 300a. The transmission line 320, the ground interconnect line 340, the transmission line 350, the transmission line 360, the transmission line 370, a transmission line 380, via-holes or through-holes 330a to 330j, the acoustic wave device 310, and the switching device 311 are connected to form the circuit pattern of the filter device 30.

The transmission line 320 illustrated in FIG. 20 corresponds to the transmission line between the switching element SW and ground illustrated in FIG. 3A. A first transmission line is formed by the via-hole or through-hole 330a, the transmission line 370, the via-hole or through-hole 330b, the transmission line 380, the via-hole or through-hole 330j, the transmission line 350, and the via-hole or through-hole 330i illustrated in FIG. 20. A second transmission line is formed by the via-hole or through-hole 330d, the transmission line 360, and the via-hole or through-hole 330e. The first transmission line and the second transmission line respectively correspond to the transmission line w1 and the transmission line w3 illustrated in FIG. 3A.

A portion of the first transmission line, and a portion of the second transmission line are each formed by a conductor containing at least one of Cu, Ag, Al, Ni, W, and Mo as a main component. The portion of the first transmission line and the portion of the second transmission line are provided in parallel with each other with no other intervening conductor, in at least one of two locations, the two locations being one of the inside, the front side, and the back side of at least one package substrate and one of the inside, the front side, and the back side of the substrate 300. For example, in the filter device 30, the transmission lines 360 and 380 are provided in parallel with no other conductor interposed therebetween as illustrated in FIG. 20. The absence of any other conductor between a portion of the transmission line 380 and a portion of the transmission line 360 in a portion of the cross-section allows for stronger magnetic coupling between the transmission line w1 and the transmission line w3. Further, the value of magnetic coupling can be adjusted by adjusting the distance between individual transmission lines, the distance between individual via-holes, or the distance between individual through-holes.

As illustrated in FIG. 20, no other conductor is present between the transmission line 380 and the transmission line 360. This ensures that the first transmission line formed by the transmission line 380, and the second transmission line formed by the transmission line 360 are magnetically coupled. The transmission line 360 is located inside the substrate 300 and positioned closer to the front side of the substrate 300 where the switching device 311 is disposed, than is the transmission line 380. That is, a portion of the second transmission line is provided inside the substrate 300 or on the front side of the substrate 300, and a portion of the first transmission line is provided closer to the back side of the substrate 300 than is the portion of the second transmission line that is located inside the substrate 300. As will be described later in detail, this configuration makes it possible to reduce the distance between the switching device 311 and the transmission line 360. Consequently, the second transmission line can be reduced in length. This helps improve the attenuation provided on the lower side of the pass band when the attenuation pole located on the lower side of the pass band and created by the resonant frequency of the first parallel-arm resonant circuit is shifted higher in frequency.

The filter device 30 may not necessarily have the above-mentioned structure but may have another structure. For example, in the above-mentioned configuration of the filter device 30, the first and second transmission lines, which are respectively formed by the transmission lines 380 and 360 each made of a conductor pattern, are magnetically coupled. In an alternative configuration, two transmission lines each formed by a via-hole or a through-hole, or two transmission lines including a transmission line formed by a conductor pattern and a transmission line formed by a via-hole or a through-hole may be magnetically coupled.

The configuration of the filter device 30 is not limited to the configuration mentioned above. The locations, shapes, or other features of the conductor patterns, via-holes, or through-holes may be altered. In an exemplary alternative configuration, the filter device 30 may not include the via-holes 330c and 330d, and the transmission line 360 constituting the second transmission line may be provided on the front side of the substrate.

Whether magnetic coupling occurs between two transmission lines depends not only on whether no other conductor is disposed between the two transmission lines in at least a portion of the cross-section, but also on the distance between transmission lines, the length of each transmission line, or other factors.

Figure 21A:
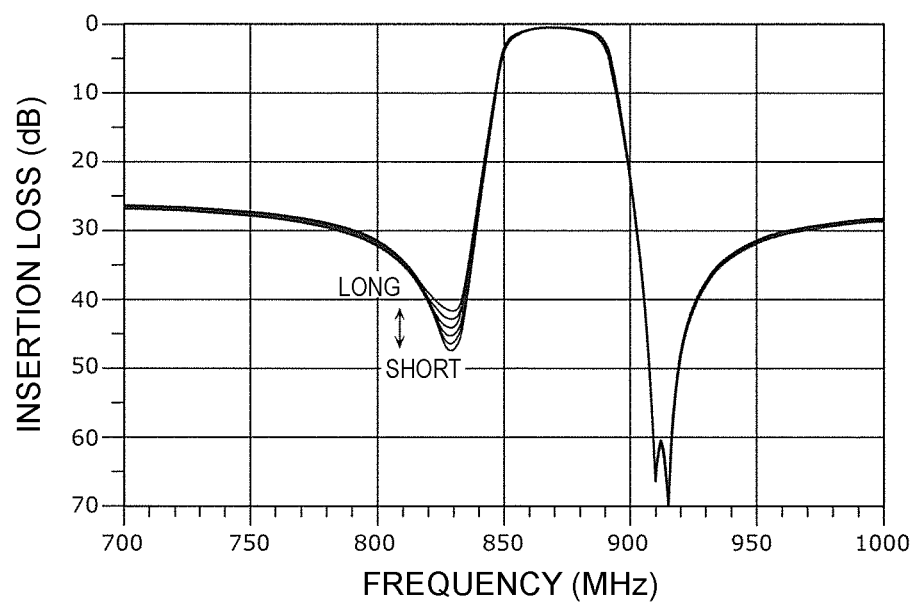
FIG. 21A illustrates the bandpass characteristics of a filter device according to Embodiment 4.

The following describes the relationship between the length of each transmission line constituting the frequency-tuning circuit, and the strength of magnetic coupling. In the following, the strength of magnetic coupling with the switching element SW placed in its ON state will be described with regard to the filter device 1 according to Embodiment 1 by way of example. FIG. 21A illustrates the bandpass characteristics of the filter device 1.

Now, a case is considered in which, for the frequency-tuning circuits 11a and 11b of the filter device 1 illustrated in FIG. 5, the respective transmission lines connected to the parallel-arm resonators p1 and p2 are changed in length. It can be appreciated from FIG. 21A that in this case, as the transmission line length decreases, insertion loss increases, leading to improved attenuation on the lower side of the pass band.

Figure 21B:
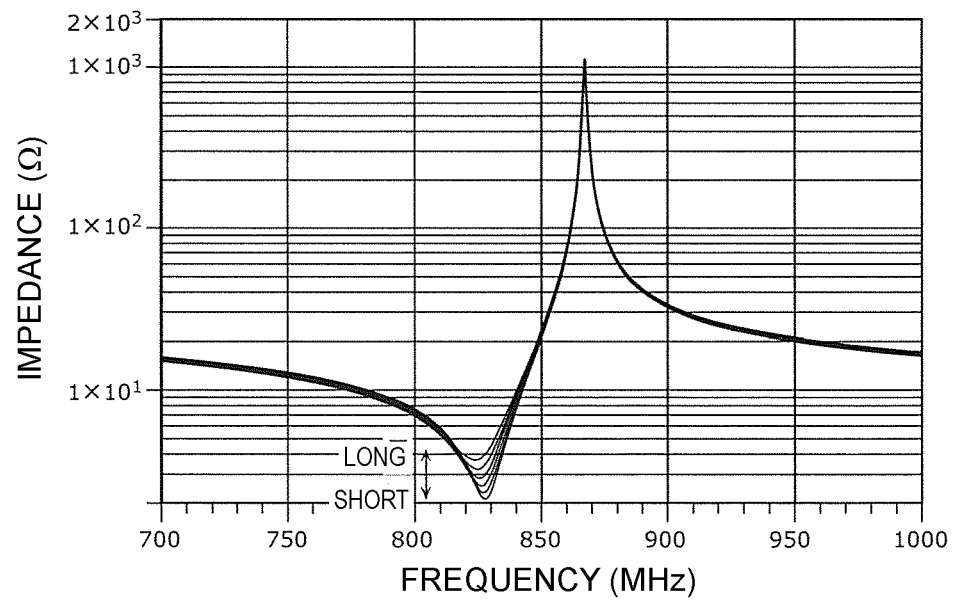
FIG. 21B illustrates the impedance characteristics of a parallel-arm resonator according to Embodiment 4.

FIG. 21B illustrates the impedance characteristics of the parallel-arm resonant circuit 20a and 20b of the filter device 1 illustrated in FIG. 5. It can be appreciated from FIG. 21B that as the transmission line length decreases, the impedance at the resonant frequency decreases, leading to improved impedance characteristics.

As described above, the attenuation characteristics of the filter device 1 on the lower side of the pass band of the filter device 1 can be improved by decreasing transmission line length in each of the frequency-tuning circuits 11a and 11b.

Embodiment 5

Next, Embodiment 5 will be described with reference to FIG. 22.

The foregoing description of Embodiments 1 to 4 is directed to a ladder filter structure with series-arm and parallel-arm resonators. However, the same technique can be applied to a ladder filter having a longitudinally coupled resonator in the series-arm resonant circuit. Accordingly, the following description of Embodiment 5 will be directed to a filter with such a structure.

Figure 22:
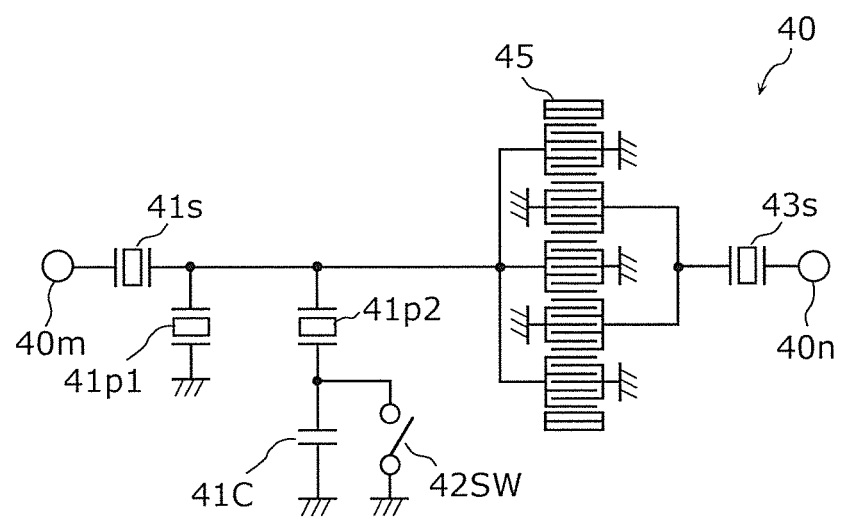
FIG. 22 illustrates the circuit configuration of a filter device according to Embodiment 5.

FIG. 22 illustrates the circuit configuration of a filter device 40 according to Embodiment 5.

As illustrated in FIG. 22, the filter device 40 includes a series-arm resonator 41s, parallel-arm resonators 41p1 and 41p2, a longitudinally coupled resonator 45, and a series-arm resonator 43s. The longitudinally coupled resonator 45 and the series-arm resonator 43s constitute a series-arm resonant circuit. The resonant frequency of the parallel-arm resonator 41p2 is higher than the resonant frequency of the parallel-arm resonator 41p1.

The filter device 40 further includes a capacitor 41C and a switching element 42SW that allow tuning of the bandpass characteristics. The capacitor 41C and the switching element 42SW are connected in parallel to each other and are connected in series with the parallel-arm resonator 41p2.

When an input/output terminal 40m is defined as a first input/output terminal, and an input/output terminal 40n is defined as a second input/output terminal, the series-arm resonator 41s corresponds to a first series-arm resonator, and to a first series-arm resonant circuit having a first series-arm resonator, the parallel-arm resonator 41p2 corresponds to a first parallel-arm resonator, the capacitor 41C corresponds to a first impedance element, and the switching element 42SW corresponds to a first switching element. The parallel-arm resonators 41p1 and 41p2, the capacitor 41C, and the switching element 42SW constitute a first parallel-arm circuit. The capacitor 41C and the switching element 42SW constitute a first switching circuit.

When the input/output terminal 40n is defined as a first input/output terminal, and the input/output terminal 40m is defined as a second input/output terminal, the series-arm resonator 43s or the longitudinally coupled resonator 45 corresponds to a first series-arm resonator. The series-arm resonator 43s and the longitudinally coupled resonator 45 constitute a first series-arm resonant circuit.

The longitudinally coupled resonator 45 represents a longitudinally coupled filter circuit positioned between the input/output terminal 40m and the input/output terminal 40n. In Embodiment 5, the longitudinally coupled resonator 45 is positioned adjacent to the input/output terminal 40n in the ladder filter structure and made up of five IDTs and reflectors disposed at both ends thereof. The longitudinally coupled resonator 45 may not be necessarily positioned adjacent to the input/output terminal 40n in the ladder filter structure but may be positioned adjacent to, for example, the input/output terminal 40m in the ladder filter structure.

Embodiment 6

Next, Embodiment 6 will be described with reference to FIG. 23.

The filter device described above with reference to each of Embodiments 1 to 5 can be applied to, for example, an RF front-end circuit. Accordingly, the following description of Embodiment 6 will be directed to a configuration of such an RF front-end circuit including the filter device 1 described above with reference to Embodiment 1.

Figure 23:
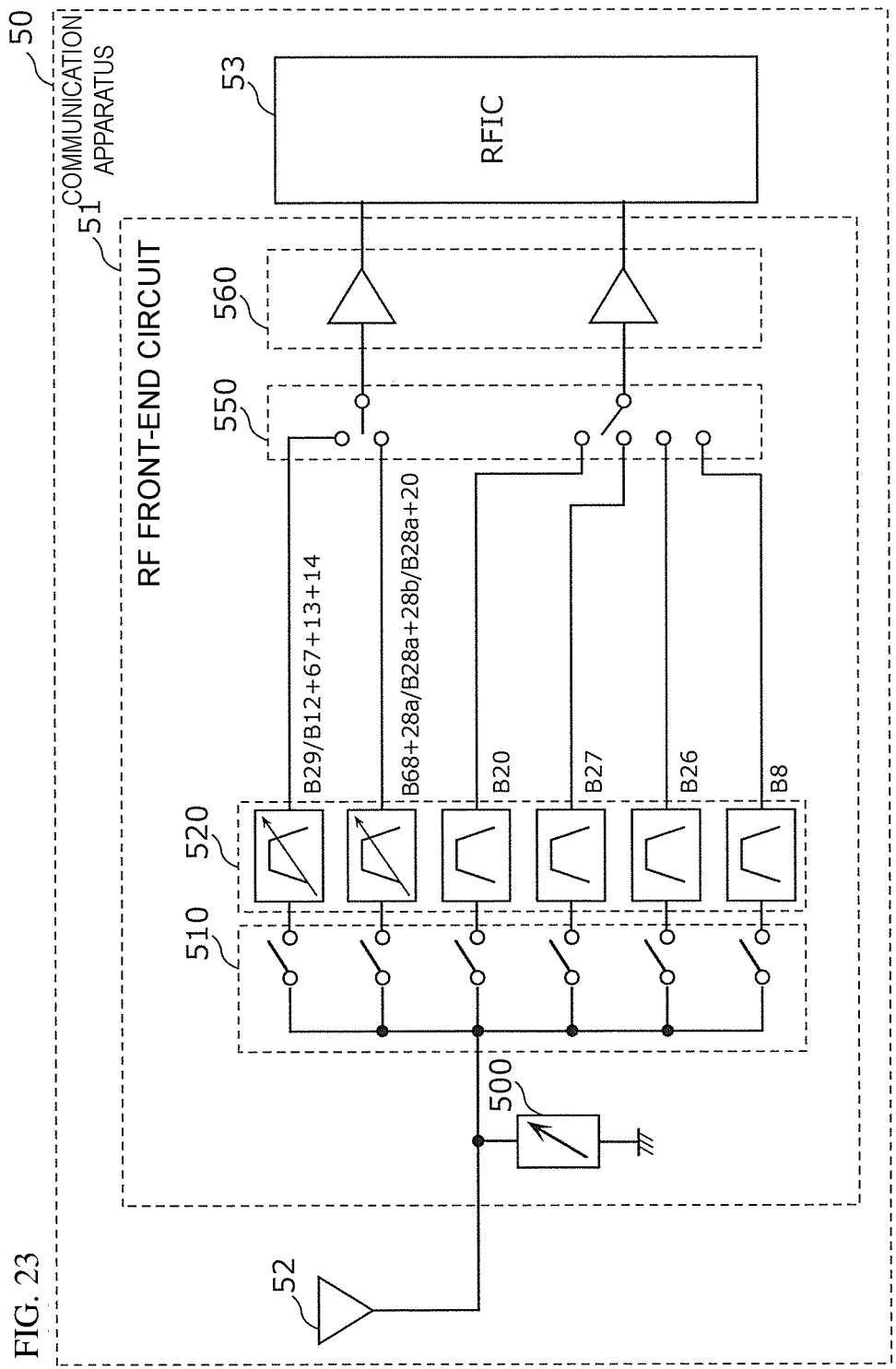
FIG. 23 illustrates the configuration of an RF front-end circuit according to Embodiment 6 and its peripheral circuitry.

FIG. 23 illustrates the configuration of an RF front-end circuit 51 according to Embodiment 6 and its peripheral circuitry. FIG. 23 illustrates the RF front-end circuit 51, an antenna element 52, and an RF integrated circuit (RFIC) 53. The RF front-end circuit 51, the antenna element 52, the RFIC 53, and a baseband integrated circuit (BBIC) (not illustrated) constitute a communication apparatus 50. The RF front-end circuit 51, the antenna element 52, and the RFIC 53 are disposed, for example, at the front-end section of a multimode/multiband-capable cellular phone.

The antenna element 52 is a multiband-capable antenna that transmits and receives an RF signal and is compliant with a communication standard such as LTE. The antenna element 52 may not support all the bands of the communication apparatus 50 but may support only a group of lower frequency bands or a group of higher frequency bands. The antenna element 52 may not be incorporated in the communication apparatus 50.

The RFIC 53 is an RF integrated circuit that processes an RF signal transmitted and received by the antenna element 52. Specifically, the RFIC 53 applies signal processing such as down-conversion to an RF signal (which in this case is an RF receive signal) input to the RFIC 53 from the antenna element 52 via the receive-side signal path of the RF front-end circuit 51, and outputs a receive signal generated through the signal processing to the baseband integrated circuit (not illustrated).

The RF front-end circuit 51 transmits an RF signal (which in this case is an RF receive signal) received by the antenna element 52 to the RFIC 53 via the receive-side signal path.

The RF front-end circuit 51 includes the following components disposed in the order stated below as viewed from the antenna element 52: a variable impedance matching circuit 500, a group of switching elements 510, a group of filters 520, a group of switching elements 550, and a group of receiving amplifier circuits 560.

The group of switching elements 510 includes at least one switching element (a plurality of switching elements in Embodiment 6) that, in accordance with a control signal from a controller (not illustrated), connects the antenna element 52 to a filter corresponding to a predetermined band. The antenna element 52 may not necessarily be connected to a single filter but may be connected to a plurality of filters.

The group of filters 520 includes one or more filters. In Embodiment 6, the group of filters 520 includes, for example, first to sixth filters described below. Specifically, the first filter is a tunable filter capable of supporting Band 29 as well as Bands 12, 67, 13, and 14. The second filter is a tunable filter capable of supporting Bands 68 and 28a, Bands 28a and 28b, and Bands 28a and 20. The filter device according to each of the above-mentioned embodiments can be used as the second filter. The third to sixth filters are each a filter with a fixed pass band. The third filter corresponds to Band 20, the fourth filter corresponds to Band 27, the fifth filter corresponds to Band 26, and the sixth filter corresponds to Band 8.

The group of switching elements 550 includes at least one switching element (a plurality of switching elements in Embodiment 6) that, in accordance with a control signal from a controller (not illustrated), connects a filter corresponding to a predetermined band to a receiving amplifier circuit corresponding to the predetermined band among the group of receiving amplifier circuits 560. Not only a single filter but also a plurality of filters may be connected to the receiving amplifier circuit mentioned above.

The group of receiving amplifier circuits 560 includes at least one low-noise amplifier (a plurality of low-noise amplifiers in Embodiment 6) that amplifies the power of an RF receive signal input from the group of switching elements 550.

In the RF front-end circuit 51 configured as described above, an RF signal (which in this case is an RF receive signal) input from the antenna element 52 is passed through a predetermined filter, and then amplified by a predetermined low-noise amplifier before being output to the RFIC 53. An RFIC corresponding to a group of lower frequency bands and an RFIC corresponding to a group of higher frequency bands may be provided individually.

The RF front-end circuit 51 includes, as a tunable filter, the filter device 1 described above with reference to Embodiment 2. In the filter device 1X described above with reference to FIG. 6B as an example of the filter device 1 with magnetic coupling, the first transmission line formed by the transmission line w1 connected to the input/output terminal 11m, and the second transmission line formed by the transmission line w4 connected with the parallel-arm resonator p2 are magnetically coupled. The RF front-end circuit 51 including the filter device 1 configured as described above makes it possible to improve the attenuation provided outside the pass band when frequency bands are switched.

As described above, the RF front-end circuit 51 includes the filter device 1 (tunable filter) according to Embodiment 2. As compared with when the RF front-end circuit 51 is provided with a filter having a fixed pass band, this configuration helps reduce the number of filters, thus enabling miniaturization.

The RF front-end circuit 51 may include, as a filter (tunable filter), the filter device corresponding to one of Embodiments 1 to 5 mentioned above.

The foregoing description of Embodiment 6 is directed to a configuration of the RF front-end circuit 51 designed for reception diversity with a plurality of filters (receiving filters) provided on the receive-side signal path. However, the configuration of the RF front-end circuit is not limited to this configuration but may be a configuration designed for transmission with a plurality of filters (transmitting filters) provided on the transmit-side signal path. Further, the configuration of the RF front-end circuit is not limited to a configuration with a plurality of receiving filters or a plurality of transmitting filters. Alternatively, the configuration of the RF front-end circuit may be a configuration with only a single receiving filter or a single transmitting filter or may be a configuration designed for both transmission and reception with at least one transmitting filter and at least one receiving filter.

Other Embodiments

Although exemplary embodiments of an acoustic wave filter device and an RF front-end circuit according to the present disclosure have been described above by way of Embodiments 1 to 6, the present disclosure is not limited to the above embodiments. The present disclosure is intended to encompass other embodiments achieved by combining given components in the above embodiments, modifications obtained by modifying the above embodiments in various ways as may become apparent to one skilled in the art without departing from the scope of the present disclosure, and various apparatuses incorporating the acoustic wave filter device and the RF front-end circuit according to the present disclosure.

The present disclosure also encompasses a multiplexer including the above-mentioned filter device, such as a duplexer. That is, in a multiplexer with a plurality of filter devices connected to a common location, at least one filter device may be one of the filter devices described above. In this case, one input/output terminal of each of the plurality of filter devices is directly or indirectly connected to a common terminal. This configuration makes it possible to provide a multiplexer with improved attenuation provided on the lower side of the pass band when the attenuation pole located on the lower side of the pass band and created by the resonant frequency of the first parallel-arm resonant circuit is shifted higher in frequency.

The present disclosure is intended to encompass not only a tunable filter but also a filter device with a fixed pass band. That is, the foregoing description of Embodiments 1 to 6 is directed to the case of a filter device including a switching element that constitutes a frequency-tuning circuit together with a capacitor. However, the filter device may not necessarily include such a switching element. Accordingly, the present disclosure is intended to also encompass an RF front-end circuit and a communication apparatus that include a filter with a fixed pass band configured as described above.

The capacitor in the frequency-tuning circuit can be a capacitor disposed on the substrate 100, for example. However, the capacitor may be a capacitor provided inside a wiring board, a capacitor mounted on a wiring board, or a capacitor disposed on a semiconductor substrate. The above-mentioned capacitor disposed on the substrate 100 may be a capacitor formed by a comb electrode or may be a parallel flat plate capacitor. Alternatively, the capacitor disposed on the substrate 100 may be a variable capacitor such as a varicap diode or a digital tunable capacitor (DTC).

In another exemplary configuration, in the RF front-end circuit or the communication apparatus, an inductor or capacitor may be connected between individual components. The inductor may include a transmission line or interconnect line connecting individual components with each other.

INDUSTRIAL APPLICABILITY

Exemplary applications of the present disclosure include a filter device, a multiplexer, a front-end circuit, and a communication apparatus that are employed in a wide variety of communication units such as cellular phones.

REFERENCE SIGNS LIST 1, 1A, 1B, 1C, 1D, 1X, 10, 10A to 10F, 10X, 10Y, 30, 40 filter device (acoustic wave filter device)
11, 11a to 11e frequency-tuning circuit (switching circuit)
11m, 40m input/output terminal (first input/output terminal)
11n, 40n input/output terminal (second input/output terminal)
20a, 20b, 20c, 21, 21A, 21B, 21C, 21D, 21E, 21F parallel-arm resonant circuit
45 longitudinally coupled resonator
50 communication apparatus
51 RF front-end circuit
52 antenna element
53 RF integrated circuit (RFIC)
100 substrate
101 adhesion layer
102 main electrode layer
103 protective layer
110a, 110b electrode fingers
111a, 111b busbar electrode
112a, 112b IDT electrode
300 substrate
300a ceramic layer
300b interlayer boundary
310 acoustic wave device
311 switching device
320, 350, 360, 370, 380 transmission line
330a to 330j via-hole or through-hole
340, 390 ground interconnect line
500 variable impedance matching circuit 510 group of switching elements
520 group of filters
550 group of switching elements
560 d
C1, C2, C3, 41C capacitor (impedance element)
SW, SW1, SW2, SW3, 42SW switching element
s1, s2, s3, 41s, 43s series-arm resonator
p1, p2, p3, 41p1, 41p2 parallel-arm resonator
w1, w2, w3, w4, w6, w9, w11 transmission line

The invention claimed is:

1. An acoustic wave filter device that has a first input/output terminal and a second input/output terminal, the acoustic wave filter device comprising:
   a first series-arm resonator that is connected in series between the first input/output terminal and the second input/output terminal; and
   a first parallel-arm resonant circuit connected between a first node and ground, the first node being between the second input/output terminal and the first series-arm resonator,
   wherein the first parallel-arm resonant circuit comprises:
      a first parallel-arm resonator, and
      a first switching circuit connected in series with the first parallel-arm resonator between the first parallel-arm resonator and ground, the first switching circuit configured to selectively tune a resonant frequency of the first parallel-arm resonant circuit by switching a state of the first switching circuit,
   wherein the first switching circuit comprises:
      a first impedance element, and
      a first switch connected in parallel with the first impedance element,
   wherein the acoustic wave filter device further comprises:
      a first transmission line that connects the first input/output terminal and the first series-arm resonator, and
      a second transmission line that connects the first parallel-arm resonator and the first impedance element, or that connects the first parallel-arm resonator and the first switch, and
   wherein the first transmission line and the second transmission line are magnetically coupled with each other.

2. The acoustic wave filter device according to claim 1, wherein a signal input at the first input/output terminal or the second input/output terminal is output from the other of the first input/output terminal or the second input/output terminal as a first signal without passing through a path created by the magnetic coupling,
   wherein another signal input at the first input/output terminal or the second input/output terminal is output from the other of the first input/output terminal or the second input/output terminal as a second signal by passing through the path created by the magnetic coupling, and
   wherein the magnetic coupling causes the first signal and the second signal to be opposite in phase and equal in amplitude at a predetermined frequency when a resonant frequency of the first parallel-arm resonant circuit is shifted higher by switching the state of the first switch, the predetermined frequency being within a stop band of the acoustic wave filter device.

3. The acoustic wave filter device according to claim 1, further comprising:
   a second series-arm resonator that is located between the first node and the second input/output terminal; and
   a second parallel-arm resonant circuit connected between a second node and ground, the second node being between the second input/output terminal and the second series-arm resonator,
   wherein the second parallel-arm resonant circuit comprises:
      a second parallel-arm resonator, and
      a second switching circuit connected in series with the second parallel-arm resonator between the second parallel-arm resonator and ground, the second switching circuit configured to selectively tune a resonant frequency of the second parallel-arm resonant circuit by switching a state of the second switching circuit,
   wherein the second switching circuit comprises:
      a second impedance element, and
      a second switch connected in parallel with the second impedance element,
   wherein the acoustic wave filter device further comprises a third transmission line that connects the second parallel-arm resonator and the second impedance element or that connects the second parallel-arm resonator and the second switch, and
   wherein the first transmission line and the third transmission line are magnetically coupled with each other.

4. The acoustic wave filter device according to claim 3, further comprising:
   at least one package substrate; and
   a wiring board,
   wherein the first series-arm resonator, the first parallel-arm resonator, the second parallel-arm resonator, the first switch, the second switch, the first impedance element, and the second impedance element are provided inside, on a front side, or on a back side of the at least one package substrate, and
   wherein each of the first transmission line and the second transmission line is provided inside, on a front side, or on a back side of the at least one package substrate, or inside, on a front side, or on a back side of the wiring board.

5. The acoustic wave filter device according to claim 4, wherein a portion of the first transmission line, and a portion of the second transmission line are each formed by a conductor having at least one of Cu, Ag, Al, Ni, W, and Mo as a main component,
   wherein the portion of the first transmission line and the portion of the second transmission line are provided in parallel with each other with no other intervening conductor, and
   wherein the portion of the first transmission line and the portion of the second transmission line are each provided inside, on the front side, or on the back side of the at least one package substrate, or inside, on the front side, or on the back side of the wiring board.

6. The acoustic wave filter device according to claim 4, wherein a portion of the second transmission line is provided inside the wiring board or on the front side of the wiring board, and
   wherein a portion of the first transmission line is provided inside the wiring board closer to a back side of the wiring board than the portion of the second transmission line, or is provided on the back side of the wiring board.

7. The acoustic wave filter device according to claim 1, further comprising:

a second parallel-arm resonant circuit connected between a second node and ground, the second node being between the first transmission line and the first series-arm resonator, wherein the second parallel-arm resonant circuit comprises:
a second parallel-arm resonator, and
a second switching circuit connected in series with the second parallel-arm resonator between the second parallel-arm resonator and ground, the second switching circuit configured to selectively tune a resonant frequency of the second parallel-arm resonant circuit by switching a state of the second switching circuit, wherein the second switching circuit comprises:
a second impedance element, and
a second switch connected in parallel with the second impedance element, wherein the acoustic wave filter device further comprises:
a fourth transmission line that connects the first node and the second input/output terminal, and
a third transmission line that connects the second parallel-arm resonator and the second impedance element, or that connects the second parallel-arm resonator and the second switch, and
wherein the third transmission line and the fourth transmission line are magnetically coupled with each other.

8. The acoustic wave filter device according to claim 7, further comprising:
at least one package substrate; and
a wiring board,
wherein the first series-arm resonator, the first parallel-arm resonator, the second parallel-arm resonator, the first switch, the second switch, the first impedance element, and the second impedance element are provided inside, on a front side, or on a back side of the at least one package substrate, and
wherein each of the first transmission line and the second transmission line is provided inside, on a front side, or on a back side of the at least one package substrate, or inside, on a front side, or on a back side of the wiring board.

9. The acoustic wave filter device according to claim 8,
wherein a portion of the first transmission line, and a portion of the second transmission line are each formed by a conductor having at least one of Cu, Ag, Al, Ni, W, and Mo as a main component,
wherein the portion of the first transmission line and the portion of the second transmission line are provided in parallel with each other with no other intervening conductor, and
wherein the portion of the first transmission line and the portion of the second transmission line are each provided inside, on the front side, or on the back side of the at least one package substrate, or inside, on the front side, or on the back side of the wiring board.

10. The acoustic wave filter device according to claim 8,
wherein a portion of the second transmission line is provided inside the wiring board or on the front side of the wiring board, and
wherein a portion of the first transmission line is provided inside the wiring board closer to a back side of the wiring board than the portion of the second transmission line, or is provided on the back side of the wiring board.

11. The acoustic wave filter device according to claim 1, further comprising:

a fifth transmission line that connects the first transmission line and the first series-arm resonator;
a series-arm circuit that is located on between the first transmission line and the fifth transmission line; and
a parallel-arm circuit that is connected between ground and a node that is between the first transmission line and the fifth transmission line,
wherein the second transmission line and the fifth transmission line are magnetically coupled with each other.

12. The acoustic wave filter device according to claim 1, wherein the first impedance element is a capacitor.

13. The acoustic wave filter device according to claim 1, wherein the first impedance element is an inductor.

14. The acoustic wave filter device according to claim 1, wherein the first impedance element is an acoustic wave resonator.

15. A multiplexer comprising
a plurality of filters including the acoustic wave filter device according to claim 1,
wherein an input/output terminal of each of the plurality of filters is connected to a common terminal of the multiplexer.

16. An RF front-end circuit comprising:
the acoustic wave filter device according to claim 1; and
an amplifier circuit connected to the acoustic wave filter device.

17. A communication apparatus comprising:
an RF integrated circuit configured to process an RF signal transmitted and received by an antenna; and
the RF front-end circuit according to claim 16, the RF front-end circuit configured to transmit the RF signal between the antenna and the RF integrated circuit.

18. An acoustic wave filter device that has a first input/output terminal and a second input/output terminal, the acoustic wave filter device comprising:
a first resonant circuit that comprises one or more series-arm resonators and that is connected in series between the first input/output terminal with the second input/output terminal;
a second resonant circuit that is connected between ground and a node located between one of the series-arm resonators and the second input/output terminal;
a first interconnect line; and
a second interconnect line,
wherein the second resonant circuit comprises:
at least one first parallel-arm resonator formed by an acoustic wave resonator, and
a frequency-tuning circuit connected between the at least one first parallel-arm resonator and ground, the frequency-tuning circuit configured to selectively tune a resonant frequency of the first parallel-arm resonator connected to the frequency-tuning circuit,
wherein the frequency-tuning circuit comprises:
an impedance element connected between the first parallel-arm resonator and ground, and
a switch connected in parallel with the impedance element between the first parallel-arm resonator and ground,
wherein the first interconnect line is connected to a portion of a series-arm resonator of the first resonant circuit located adjacent to the first input/output terminal,
wherein the second interconnect line connects the parallel-arm resonator with the switch, or connects the parallel-arm resonator with the impedance element, and
wherein a first transmission line formed by the first interconnect line, and a second transmission line formed by the second interconnect line are magnetically coupled with each other.

\* \* \* \* \*

UNITED STATES PATENT AND TRADEMARK OFFICE
CERTIFICATE OF CORRECTION

PATENT NO. : 10,715,110 B2
APPLICATION NO. : 16/354276
DATED : July 14, 2020
INVENTOR(S) : Atsushi Horita et al.

Page 1 of 1

It is certified that error appears in the above-identified patent and that said Letters Patent is hereby corrected as shown below:

In the Specification

Column 14, Line 46:
"impedance (ideally OS))."
Should be:
-- impedance (ideally 0Ω). --

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*